(12) United States Patent
Hayashi

(10) Patent No.: US 10,008,437 B2
(45) Date of Patent: Jun. 26, 2018

(54) LEAD FRAME AND ELECTRONIC COMPONENT DEVICE

(71) Applicant: SHINKO ELECTRIC INDUSTRIES CO., LTD., Nagano-shi, Nagano (JP)

(72) Inventor: Shintaro Hayashi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days. days.

(21) Appl. No.: 15/690,532

(22) Filed: Aug. 30, 2017

(65) Prior Publication Data
US 2018/0061746 A1   Mar. 1, 2018

(30) Foreign Application Priority Data
Aug. 31, 2016 (JP) .................... 2016-168847

(51) Int. Cl.
*H01L 23/495* (2006.01)
*H01L 23/31* (2006.01)

(52) U.S. Cl.
CPC .... *H01L 23/49582* (2013.01); *H01L 23/3121* (2013.01); *H01L 23/4952* (2013.01); *H01L 23/49503* (2013.01)

(58) Field of Classification Search
CPC ........... H01L 23/49582; H01L 23/3121; H01L 23/4952; H01L 23/49503
See application file for complete search history.

(56) References Cited

U.S. PATENT DOCUMENTS

| | | | | |
|---|---|---|---|---|
| 8,076,184 B1* | 12/2011 | Camacho | ................ | H01L 24/29 257/E21.499 |
| 2009/0032943 A1* | 2/2009 | Shoji | .................... | H01L 21/4832 257/737 |
| 2011/0272793 A1* | 11/2011 | Shimizu | .............. | H01L 21/4832 257/666 |
| 2012/0104585 A1* | 5/2012 | Espiritu | .............. | H01L 21/4832 257/676 |
| 2012/0139104 A1* | 6/2012 | Camacho | ............ | H01L 21/4832 257/737 |
| 2013/0154080 A1* | 6/2013 | Do | ...................... | H01L 23/4334 257/706 |
| 2013/0249065 A1* | 9/2013 | Do | ...................... | H01L 23/3107 257/666 |
| 2013/0249077 A1* | 9/2013 | Do | .......................... | H01L 23/28 257/737 |
| 2016/0268188 A1* | 9/2016 | Kariya | ................ | H01L 23/3121 |
| 2017/0125328 A1* | 5/2017 | Hayashi | ........... | H01L 23/49558 |

FOREIGN PATENT DOCUMENTS

| | | | | |
|---|---|---|---|---|
| JP | 2009-164232 | * | 7/2009 | ........................ 23/50 |
| JP | 2011-029335 | | 2/2011 | |

\* cited by examiner

*Primary Examiner* — Victor A Mandala
(74) *Attorney, Agent, or Firm* — Rankin, Hill & Clark LLP

(57) ABSTRACT

An electronic component device, includes: a lead frame including a terminal portion, the terminal portion including a columnar electrode and a metal plating layer, wherein the metal plating layer is formed on a lower surface of the electrode and a portion of a side surface of the electrode; an electronic component mounted on the lead frame to be electrically connected to the terminal portion; and a sealing resin that seals the lead frame and the electronic component, wherein another portion of the side surface of the electrode is embedded in the sealing resin and the metal plating layer is exposed from the sealing resin.

16 Claims, 25 Drawing Sheets

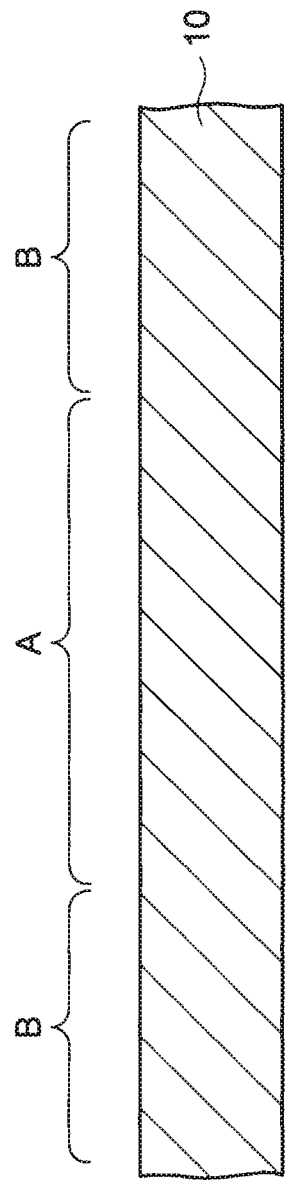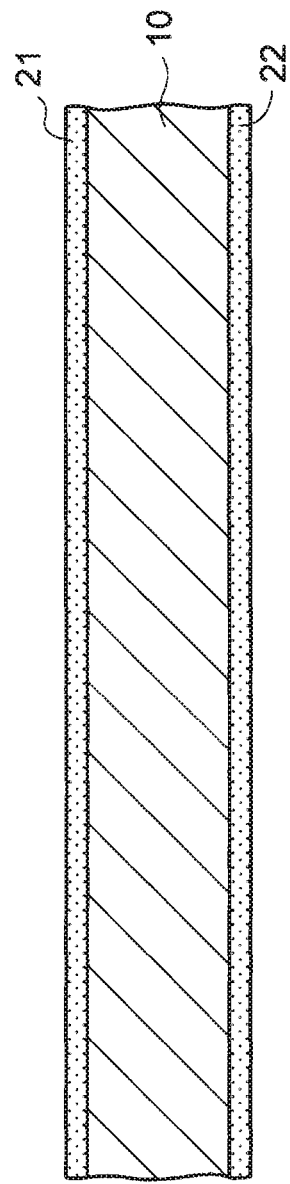

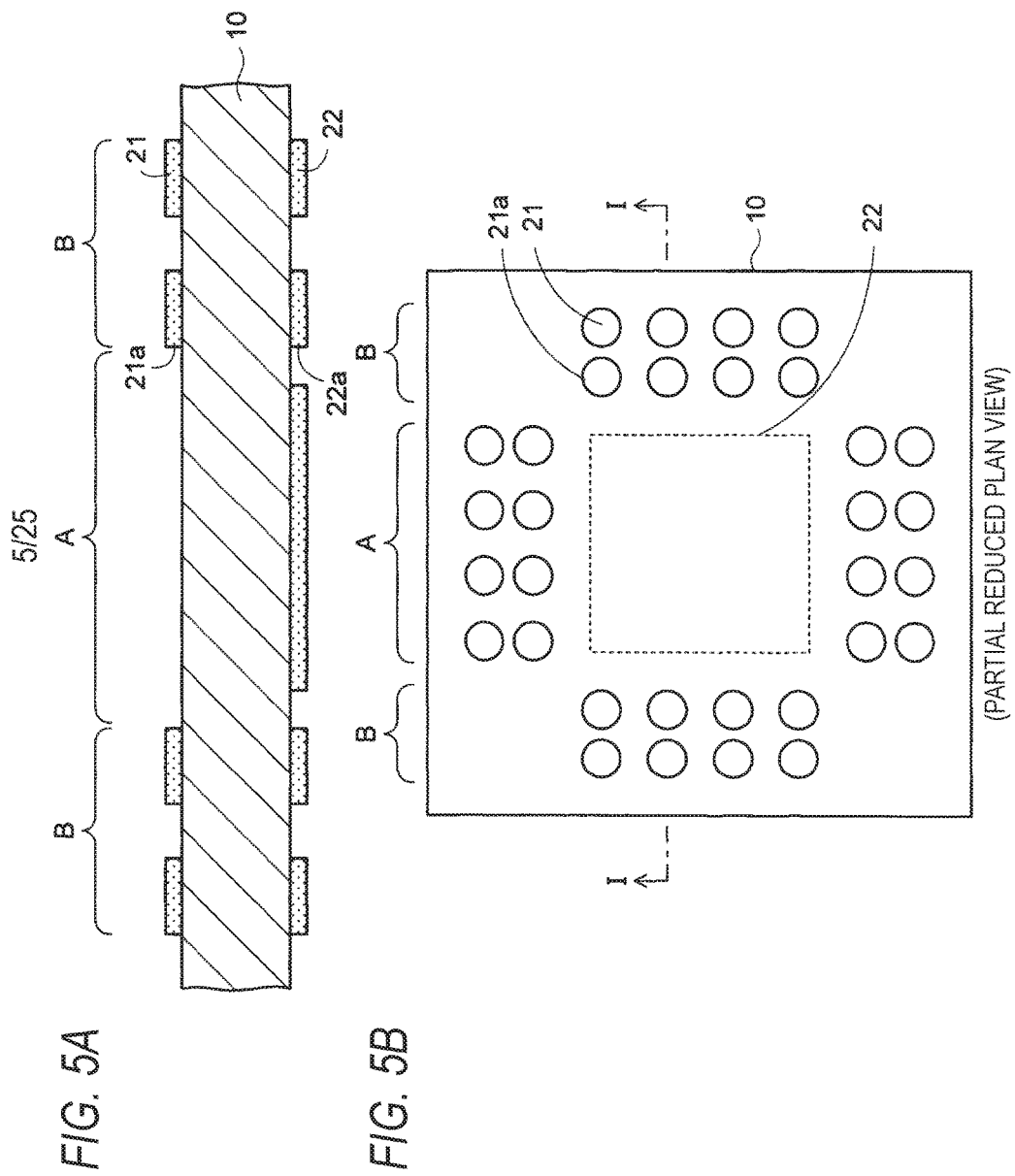

(PARTIAL ENLARGED SECTIONAL VIEW)

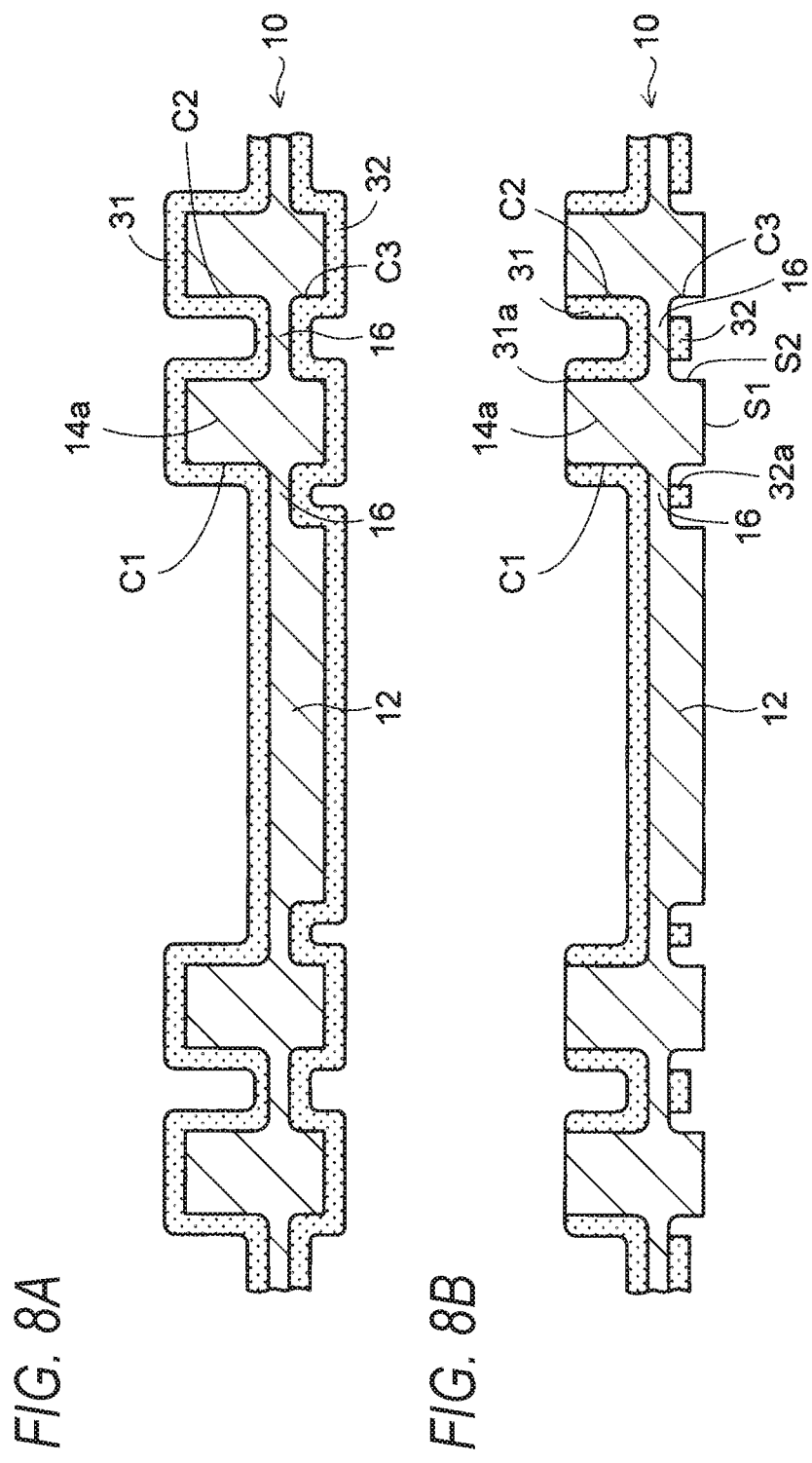

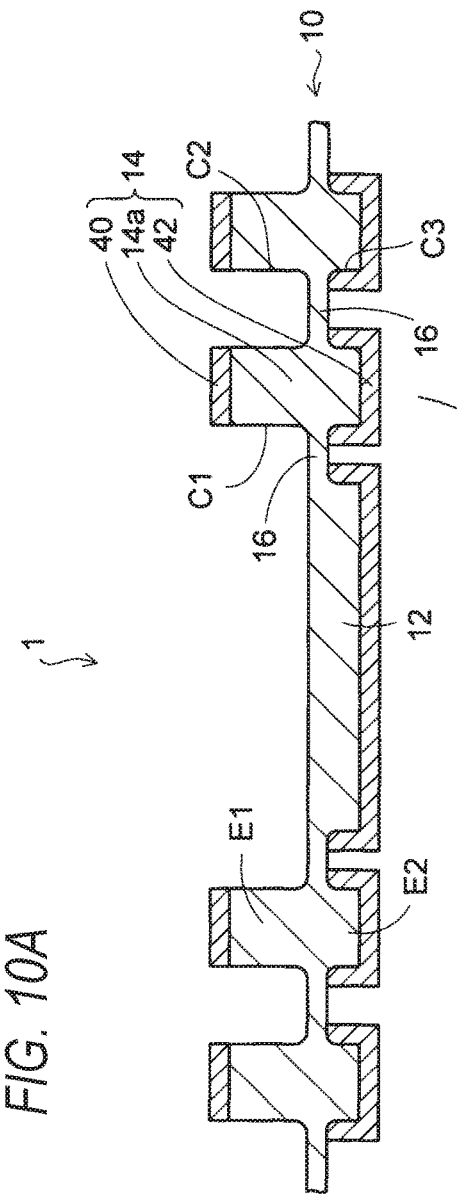
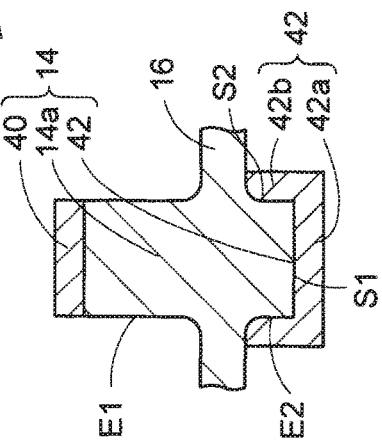
FIG. 10A
FIG. 10B (PARTIAL ENLARGED SECTIONAL VIEW)

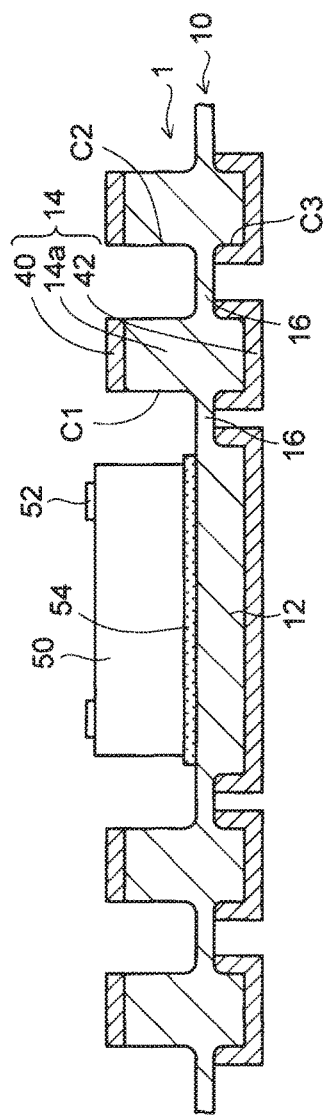
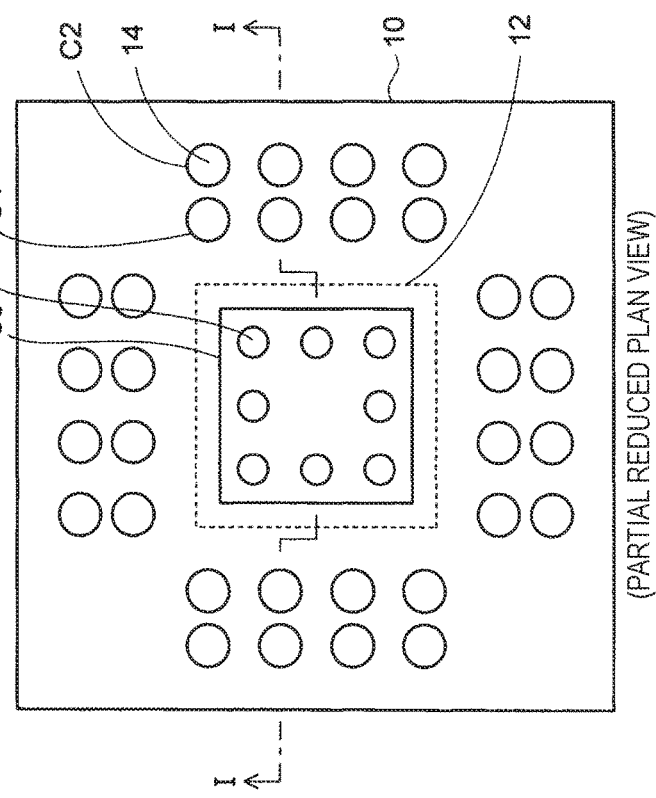

(PARTIAL ENLARGED SECTIONAL VIEW)

(THE EMBODIMENT)

(COMPARATIVE EXAMPLE)

(PARTIAL REDUCED PLAN VIEW)

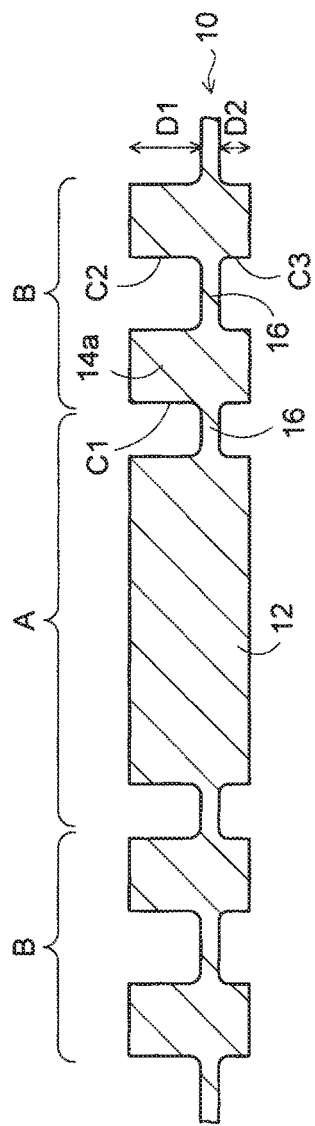
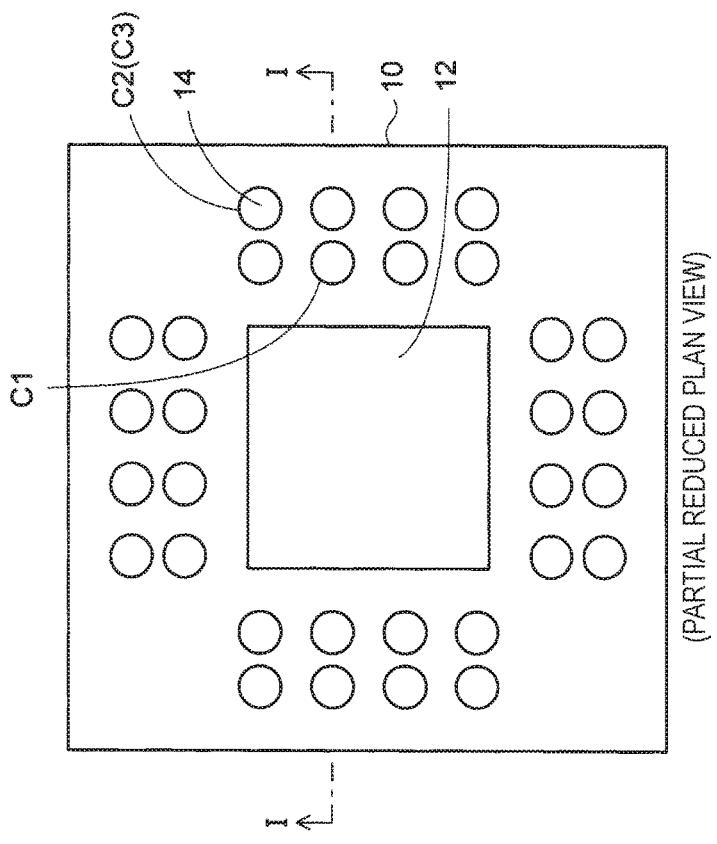
FIG. 17A
FIG. 17B

LEAD FRAME AND ELECTRONIC COMPONENT DEVICE

This application claims priority from Japanese Patent Application No. 2016-168847, filed on Aug. 31, 2016, the entire contents of which are herein incorporated by reference.

BACKGROUND

1. Technical Field

The present disclosure relates to a lead frame and an electronic component device.

2. Background Art

In the background art, there are lead frames for mounting electronic components such as semiconductor chips. In such a lead frame, a semiconductor chip mounted on a die pad is connected to peripheral leads through wires, and the semiconductor chip and the wires are sealed with a sealing resin (see e.g., JP-A-2011-29335).

As will be described in paragraphs about a preliminary matter described later, a manufacturing method for an electronic component device using a lead frame includes wet-etching a copper plate from a lower surface side thereof to thereby separate a die pad portion and a plurality of terminal portions individually (see FIGS. 3B and 3C).

On this occasion, an etching amount of the copper plate is relatively large. Accordingly, a processing time for the etching becomes long so that there is a problem that production efficiency may be poor.

In addition, when a pitch between adjacent ones of the terminal portions is narrowed to thereby reduce an area of each of lower surfaces of the terminal portions accordingly, a contact area between the terminal portion and a solder becomes smaller. Accordingly, connection strength between the electronic component device and a mount board cannot be obtained satisfactorily.

SUMMARY

According to one or more aspects of the present disclosure, there is provided a lead frame. The lead frame comprises: a terminal portion comprising a columnar electrode and a metal plating layer, wherein the metal plating layer is formed on a lower surface of the electrode and a portion of a side surface of the electrode.

According to one or more aspects of the present disclosure, there is provided an electronic component device.

The electronic component device comprises:

a lead frame comprising a terminal portion, the terminal portion comprising a columnar electrode and a metal plating layer, wherein the metal plating layer is formed on a lower surface of the electrode and a portion of a side surface of the electrode;

an electronic component mounted on the lead frame to be electrically connected to the terminal portion; and a sealing resin that seals the lead frame and the electronic component, wherein another portion of the side surface of the electrode is embedded in the sealing resin and the metal plating layer is exposed from the sealing resin.

BRIEF DESCRIPTION OF DRAWINGS

FIGS. 4A and 4B are sectional views (Part 1) showing a manufacturing method for a lead frame according to a first embodiment;

FIGS. 5A and 5B are a sectional view and a plan view (Part 2) showing the manufacturing method for the lead frame according to the first embodiment;

FIGS. 8A and 8B are sectional views (Part 5) showing the manufacturing method for the lead frame according to the first embodiment;

FIGS. 10A and 10B are sectional views showing the lead frame according to the first embodiment;

FIGS. 11A and 11B are a sectional view and a partial plan view (Part 1) showing a manufacturing method for an electronic component device according to the first embodiment;

FIGS. 17A and 17B are a sectional view and a plan view (Part 2) showing the manufacturing method for the lead frame according to the second embodiment;

DETAILED DESCRIPTION

Embodiments will be described below with reference to the accompanying drawings.

A preliminary matter underlying the embodiments will be described prior to description of the embodiments.

FIGS. 1A to 1C and FIGS. 2A to 2C are views for explaining a lead frame according to the preliminary matter. Description of the preliminary matter is about the details of personal study of the present inventor, which contain techniques rather than known techniques.

Figure 1A:
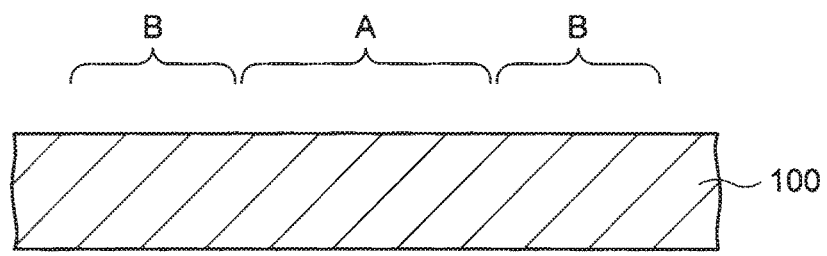
FIGS. 1A to 1C are sectional views (Part 1) showing a manufacturing method for an electronic component device using a lead frame according to a preliminary matter.

In a manufacturing method for the lead frame according to the preliminary matter, first, a copper plate 100 is prepared, as shown in FIG. 1A. A die pad formation region A and terminal formation regions B surrounding the die pad formation region A are defined in the copper plate 100.

Figure 1B:
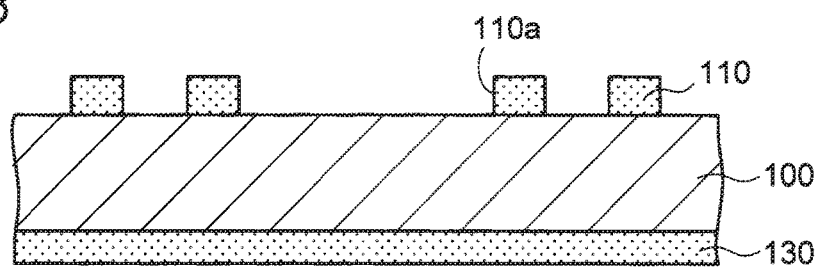

Next, a first resist layer 110 provided with an opening portion 110a is formed on an upper surface of the copper plate 100, as shown in FIG. 1B. Further, a second resist layer 130 is formed all over a lower surface of the copper plate 100 to thereby protect the lower surface.

The die pad formation region A of the copper plate 100 is disposed within the opening portion 110a of the first resist layer 110. In each of the terminal formation regions B of the copper plate 100, patterns of the first resist layer 110 are disposed like islands on portions where terminal portions will be disposed.

Figure 1C:
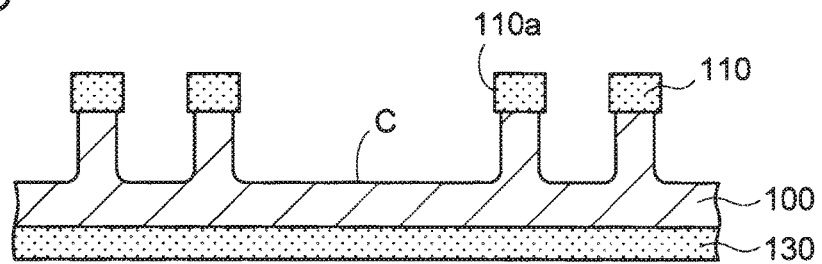

Successively, the copper plate 100 is wet-etched to the middle of its thickness through the opening portion 110a of the first resist layer 110 to thereby form a recess C, as shown in FIG. 1C. When, for example, the thickness of the copper plate 100 is about 120 μm, the depth of the recess C is set at about 90 μm.

Figure 2A:
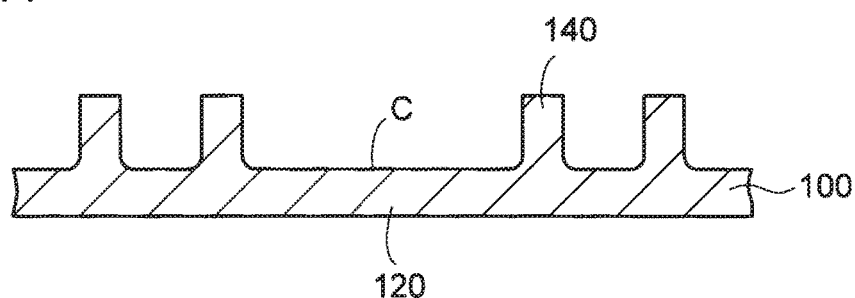
FIGS. 2A to 2C are sectional views (Part 2) showing the manufacturing method for the electronic component device using the lead frame according to the preliminary matter.

Then, the first resist layer 110 and the second resist layer 130 are removed, as shown in FIG. 2A.

The recess C is formed on the surface side of the copper plate 100. Thus, the recess C is sectioned in a state in which a die pad portion 120 is connected to the terminal portions 140 disposed around the die pad portion 120.

Figure 2B:
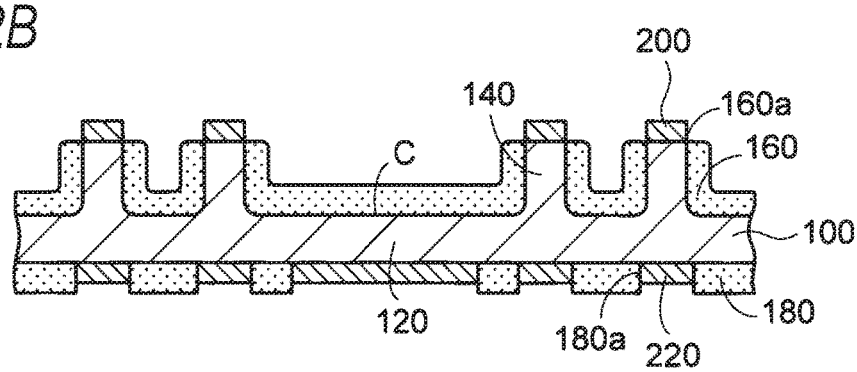

Next, a first plating resist layer 160 having opening portions 160a provided at upper surfaces of the terminal portions 140 is formed on the copper plate 100, as shown in FIG. 2B. In addition, a second plating resist layer 180 having opening portions 180a provided at portions which will serve as lower surfaces of the terminal portions 140 is formed on the lower side of the copper plate 100.

Also as shown in FIG. 2B, a first metal plating layer 200 is formed within the opening portions 160a of the first plating resist layer 160 by electrolytic plating using the copper plate 100 as a power feed path for the plating. Moreover, in the same manner, a second metal plating layer 220 is formed within the opening portions 180a of the second plating resist layer 180.

Figure 2C:
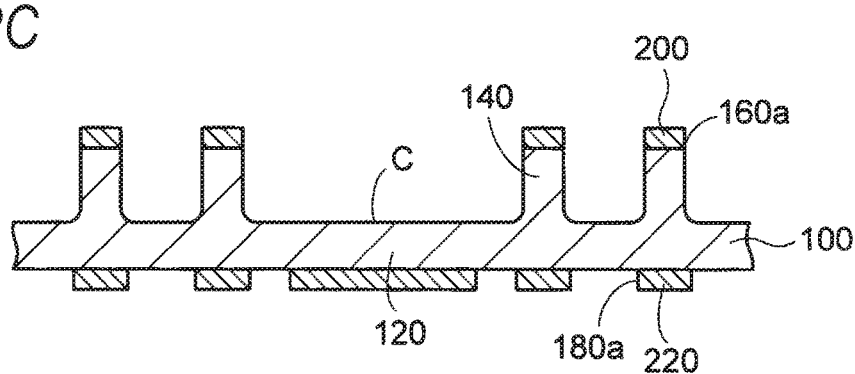

Then, the first plating resist layer 160 and the second plating resist layer 180 are removed, as shown in FIG. 2C.

Figure 3A:
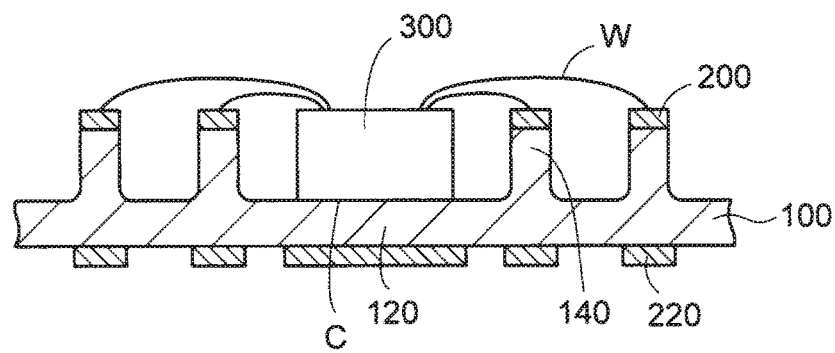
FIGS. 3A to 3C are sectional views (Part 3) showing the manufacturing method for the electronic component device using the lead frame according to the preliminary matter.

Next, a semiconductor chip 300 is mounted in a face-up manner on the die pad portion 120 of the copper plate 100, as shown in FIG. 3A. Further, connection terminals of the semiconductor chip 300 are connected to the first metal plating layer 200 on the upper surfaces of the terminal portions 140 of the copper plate 100 through wires W.

Figure 3B:
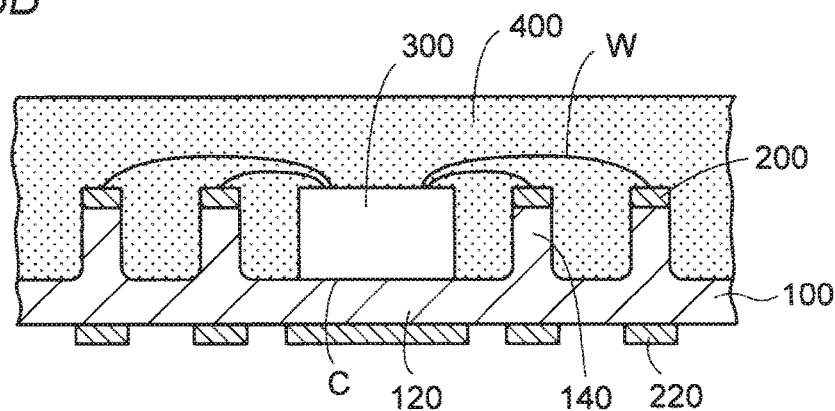

Successively, a sealing resin 400 is formed to seal the copper plate 100, the semiconductor chip 300, the terminal portions 140 and the wires W, as shown in FIG. 3B.

Figure 3C:
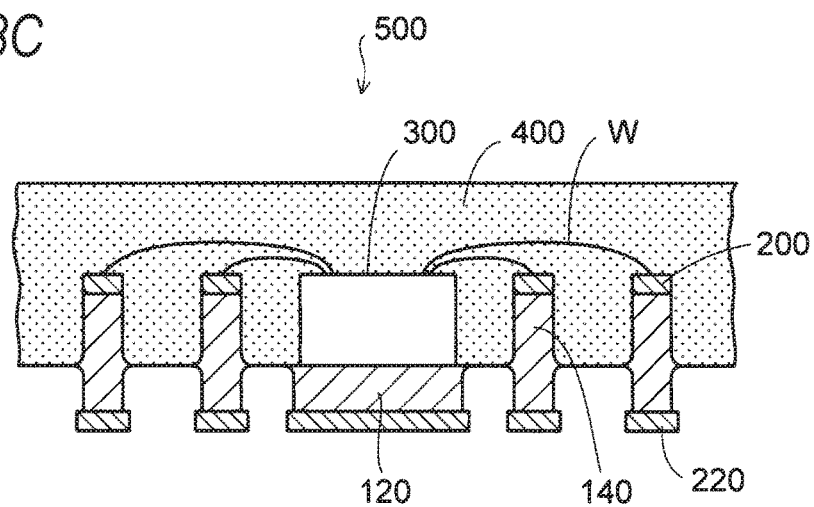

Then, as shown in FIG. 3C, using the second metal plating layer 220 on the lower surface of the copper plate 100 as a mask, the copper plate 100 is wet-etched from its lower surface. The etching is performed until an etching surface of the copper plate 100 etched from its lower surface communicates with the recess C of the copper plate 100.

Thus, the copper plate 100 is bored and patterned so that the die pad portion 120 and the terminal portions 140 surrounding the die pad portion 120 can be separated individually. The terminal portions 140 formed thus are provided with the first metal plating layer 200 on their upper surfaces, and the second metal plating layer 220 on their lower surfaces. A nickel layer/a palladium layer/a gold layer functioning as a contact layer are formed as each of the first metal plating layer 200 and the second metal plating layer 220.

In the aforementioned manner, the semiconductor chip 300 is mounted on the die pad portion 120 and electrically connected to the terminal portions 140 through the wires W. Thus, an electronic component device 500 is built.

When the thickness of the copper plate 100 is 120 μm and the depth of the recess C is 90 μm as described above, an etching amount of the copper plate 100 in the step of FIG. 3C is 30 μm. Thus, the etching amount of the copper plate 100 from the lower surface thereof in the step of FIG. 3C is relatively large. Accordingly, a processing time for the etching is long so that there is a problem that production efficiency may be poor.

When the recess C is made deeper, the etching amount of the copper plate 100 from the lower surface thereof in the step of FIG. 3C can be reduced. However, when a distance between adjacent ones of the terminal portions 140 is narrow, a recess between the adjacent terminal portions 140 becomes too wide to secure a sufficient area in each of the upper surfaces of the terminal portions 140.

In addition, when each of the terminal portions 140 of the electronic component device 500 is connected to a mount board by a solder, the solder is formed only on the second metal plating layer 220 on the lower side of the terminal portion 140. This is because copper oxide is exposed in a side surface of the terminal portion 140 so that wettability of the solder cannot be obtained therein.

Particularly when a pitch between adjacent ones of the terminal portions 140 is narrowed to thereby reduce an area of each of the lower surfaces of the terminal portions 140 accordingly, a contact area between the second metal plating layer 220 and the solder becomes smaller. Therefore, connection strength between the electronic component device 500 and the mount board cannot be obtained satisfactorily.

The aforementioned problems can be solved by any of lead frames according to the embodiments which will be described below.

First Embodiment

FIGS. 4A and 4B, FIGS. 5A and 5B, FIGS. 6A and 6B, FIGS. 7A and 7B, FIGS. 8A and 8B and FIG. 9 are views for explaining a manufacturing method for a lead frame according to a first embodiment. FIGS. 10A and 10B provide a view showing the lead frame according to the first embodiment. FIGS. 11A and 11B, FIGS. 12A and 12B, FIG. 13, FIGS. 14A and 14B, and FIGS. 15A and 15B are views for explaining an electronic component device according to the first embodiment.

The structure of the lead frame and the structure of the electronic component device will be described below while the manufacturing method for the lead frame and the electronic component device is described.

In the manufacturing method for the lead frame according to the first embodiment, first, a metal plate 10 is prepared, as shown in FIG. 4A.

As a preferred example of the metal plate 10, a copper plate made of a copper alloy can be used. Alternatively, various metal plates of 42 Alloy (42% nickel (Ni)-iron (Fe)) etc. can be used as long as they can be used as lead frames. The thickness of the metal plate 10 is, for example, about 120 μm.

A die pad formation region A and terminal formation regions B surrounding the die pad formation region A are defined in the metal plate 10. One metal plate 10 from which lead frames can be obtained contains a plurality of product regions provided in a lattice pattern. The die pad formation region A and the terminal formation regions B are provided in each of the product regions.

Next, a first resist layer 21 is formed on an upper surface of the metal plate 10 and a second resist layer 22 is formed on a lower surface of the metal plate 10, as shown in FIG. 4B. A dry film resist or a liquid resist is used as each of the first resist layer 21 and the second resist layer 22.

Further, the first resist layer 21 on the upper surface of the metal plate 10 is exposed to light and developed based on photolithography. Thus, the first resist layer 21 is patterned so that an opening portion 21a can be formed, as shown in FIG. 5A.

FIG. 5B is a partial reduced plan view of FIG. 5A. A sectional view of the FIG. 5A corresponds to a section taken along a line I-I of the plan view of FIG. 5B. The same rule is also applied to other drawings.

Refer to the partial reduced plan view of FIG. 5B additionally. The first resist layer 21 is patterned like islands disposed in portions of the terminal formation regions B of the metal plate 10, which will serve as terminal portions respectively. The die pad formation region A of the metal plate 10 is collectively exposed in the opening portion 21a of the first resist layer 21.

In addition, in the same manner, the second resist layer 22 on the lower surface of the metal plate 10 is exposed to light and developed based on photolithography. Thus, the second resist layer 22 is patterned so that an opening portion 22a can be formed, as shown in FIG. 5A.

The patterns of the second resist layer 22 are collectively disposed in the die pad formation region A of the metal plate 10 and disposed like islands in portions of the terminal formation regions B, which will serve as the terminal portions respectively.

In each of the terminal formation regions B, the patterns of the first resist layer 21 and the patterns of the second resist layer 22 are disposed in positions corresponding to each other respectively.

Figure 6A:
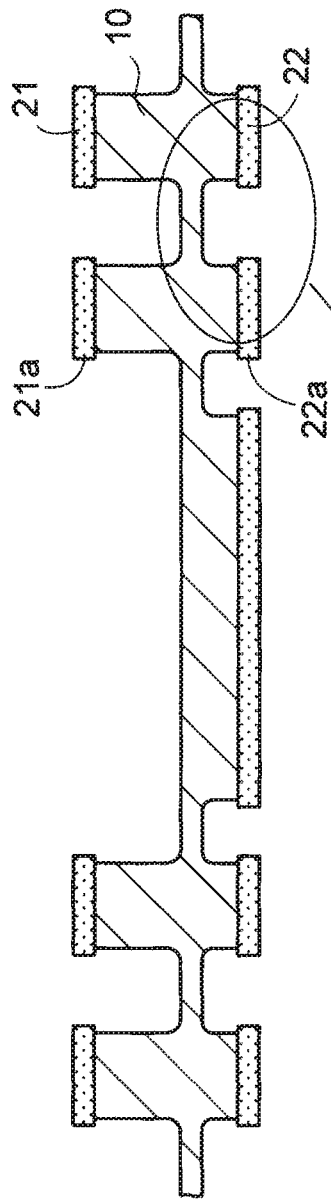
FIGS. 6A and 6B are sectional views (Part 3) showing the manufacturing method for the lead frame according to the first embodiment.

Successively, the metal plate 10 is wet-etched to the middle of its thickness from opposite sides through the opening portion 21a of the first resist layer 21 and the opening portion 22a of the second resist layer 22 on the opposite surface sides of the metal plate 10, as shown in FIG. 6A.

When the copper plate is used as the metal plate 10, a ferric chloride solution, a cupric chloride solution, or the like can be used as an aqueous etchant. A spray etching device is preferably used as an etching device.

Figure 6B:
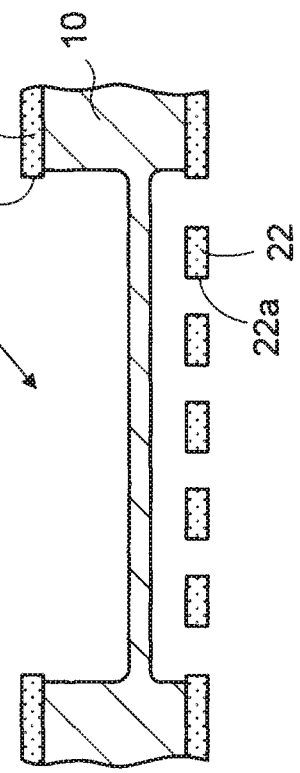

On this occasion, a depth with which the metal plate 10 has to be etched from its upper surface is set to be larger than a depth with which the metal plate 10 has to be etched from its lower surface. In order to perform such etching, the collective opening portion 21a of the first resist layer 21 is disposed in an etching region on the upper surface side of the metal plate 10, as shown in a schematic view of FIG. 6B. On the other hand, the second resist layer 22 is patterned like islands or meshes disposed in an etching region on the lower surface side of the metal plate 10 so that an aperture ratio can be reduced. FIG. 6B is a partial enlarged view of the metal plate 10 shown in FIG. 6A.

Thus, on the upper surface side of the metal plate 10, the supply of the etchant is increased so that an etching rate can be increased. On the other hand, on the lower surface side of the metal plate 10, the supply of the etchant is reduced so that the etching rate can be reduced.

Alternatively, when the opposite surfaces of the metal plate 10 are etched by the spray etching device, conditions such as pressures of the aqueous etchant to be supplied to the upper surface and the lower surface of the metal plate 10 may be adjusted so that the etching rate on the upper surface side of the metal plate 10 can be made higher.

Figure 7A:
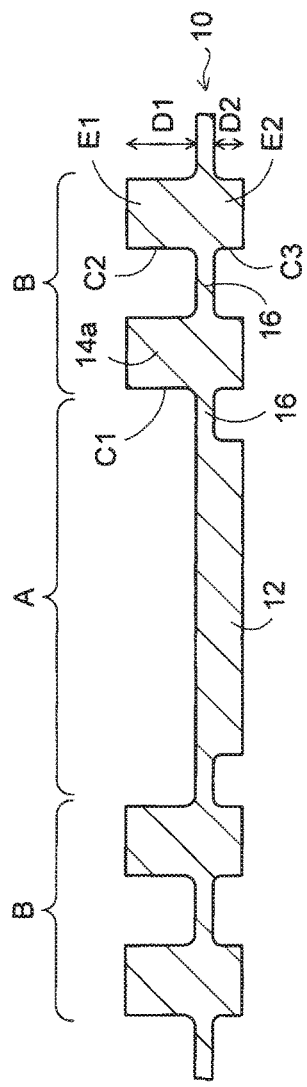
FIGS. 7A and 7B are a sectional view and a plan view (Part 4) showing the manufacturing method for the lead frame according to the first embodiment.

FIG. 7A shows a state in which the first resist layer 21 and the second resist layer 22 have been removed from the metal plate 10 shown in FIG. 6A.

As shown in FIG. 7A, in the die pad formation region A in the upper surface of the metal plate 10, the metal plate 10 is etched to the middle of its thickness from its upper surface so that a first recess C1 can be formed. In addition, since the lower surface of the metal plate 10 in the die pad formation region A is protected by the aforementioned second resist layer 22 shown in FIG. 6A, the lower surface of the metal plate 10 in the die pad formation region A is not etched but stays behind.

Thus, a die pad portion 12 made of a bottom plate of the first recess C1 is formed in the metal plate 10.

In addition, in each of the terminal formation regions B in the upper surface of the metal plate 10, the metal plate 10 is etched to the middle of its thickness from its upper surface so that a second recess C2 can be formed.

Moreover, in the terminal formation region B in the lower surface of the metal plate 10, the metal plate 10 is etched to the middle of its thickness from its lower surface so that a third recess C3 can be formed. Refer to a partial reduced plan view of FIG. 7B additionally. The second recess C2 and the third recess C3 are disposed correspondingly in regions overlapping with each other in plan view.

Figure 7B:
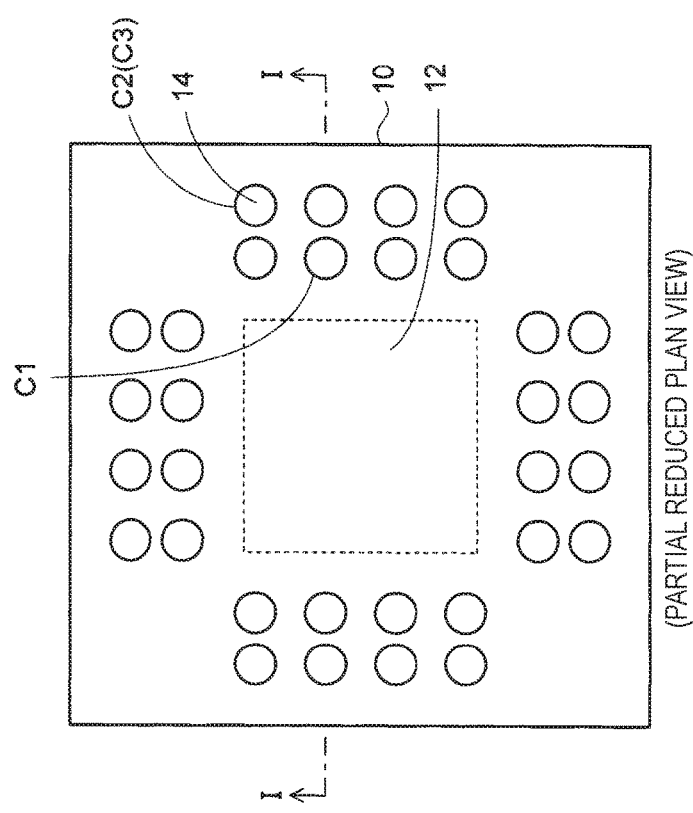

In this manner, the opposite surfaces of the metal plate 10 are patterned by the first recess C1, the second recess C2 and the third recess C3. Each of the patterns of the die pad portion 12 and the electrodes 14a is formed. In the example of FIG. 7B, the electrodes 14a are formed like circular columns on the opposite surfaces of the metal plate 10.

Each of the electrodes 14a is provided with a protruding portion E1 and a protruding portion E2. The protruding portion E1 protrudes upward from an upper surface of a coupling portion 16 of the metal plate 10. The protruding portion E2 protrudes downward from a lower surface of the coupling portion 16 of the metal plate 10.

Alternatively, lead wiring portions in which lead-out wirings are coupled to the electrodes 14a may be formed.

In addition, the die pad portion 12 is formed into a rectangle in plan view by way of example.

In addition, between the first recess C1 and the second recess C2 on the upper surface side and the third recess C3 on the lower surface side, a remaining thin plate portion of the metal plate 10 serves as the coupling portion 16.

The die pad portion 12 is coupled to the electrodes 14a by the coupling portion 16. In addition, the plurality of electrodes 14a are coupled to one another by the coupling portion 16.

As described above, the columnar electrodes 14a each of which has the protruding portion E1 provided on the upper surface of the metal plate 10 and the protruding portion E2 provided on the lower surface of the metal plate 10 are formed. The die pad portion 12 and the plurality of electrodes 14a are coupled to each other by the coupling portion 16.

When, for example, the thickness of the metal plate 10 is 120 μm, a depth D1 of each of the first recess C1 and the second recess C2 on the upper surface side is set at about 90 μm, and a depth D2 of the third recess C3 on the lower surface side is set at about 10 μm to 20 μm.

Thus, in the embodiment, the first recess C1 and the second recess C2 are formed from the upper surface of the metal plate 10, and the third recess C3 is formed from the lower surface of the metal plate 10 in advance. Thus, as will be described later, an etching amount when the coupling portion 16 made of the thin plate portion of the metal plate 10 is etched so as to separate the electrodes 14a individually can be reduced more greatly than that in the structure according to the preliminary matter.

The third recess C3 in the lower surface of the metal plate 10 is formed simultaneously with the first recess C1 and the second recess C2 in the upper surface of the metal plate 10. Therefore, the formation of the third recess C3 does not cause any increase in the number of steps.

Next, as shown in FIG. 8A, a first plating resist layer 31 is formed on an upper surface of a structure body shown in FIG. 7A, and a second plating resist layer 32 is formed on a lower surface of the structure body. As a formation method for the first plating resist layer 31 and the second plating resist layer 32, the metal plate 10 in which the first to third recesses C1 to C3 have been formed is immersed in a liquid resist so that the resist can be deposited on each of the opposite surfaces of the metal plate 10.

Alternatively, each of the first plating resist layer 31 and the second plating resist layer 32 may be formed by an electrodepositing resist.

Further, the first plating resist layer 31 on the upper surface of the metal plate 10 is exposed to light and developed based on photolithography, as shown in FIG. 8B. As a result, the first plating resist layer 31 is patterned so that opening portions 31a can be formed. The opening portions 31a of the first plating resist layer 31 are disposed on upper surfaces of the electrodes 14a to expose the upper surfaces of the electrodes 14a.

Successively, the second plating resist layer 32 on the lower surface of the metal plate 10 is exposed to light and developed based on photolithography. As a result, the second plating resist layer 32 is patterned so that opening portions 32a can be formed.

The opening portions 32a of the second plating resist layer 32 are disposed to expose lower surfaces S1 and side surface lower portions S2 of the electrodes 14a and a lower surface and a side surface of the die pad portion 12.

Figure 9:
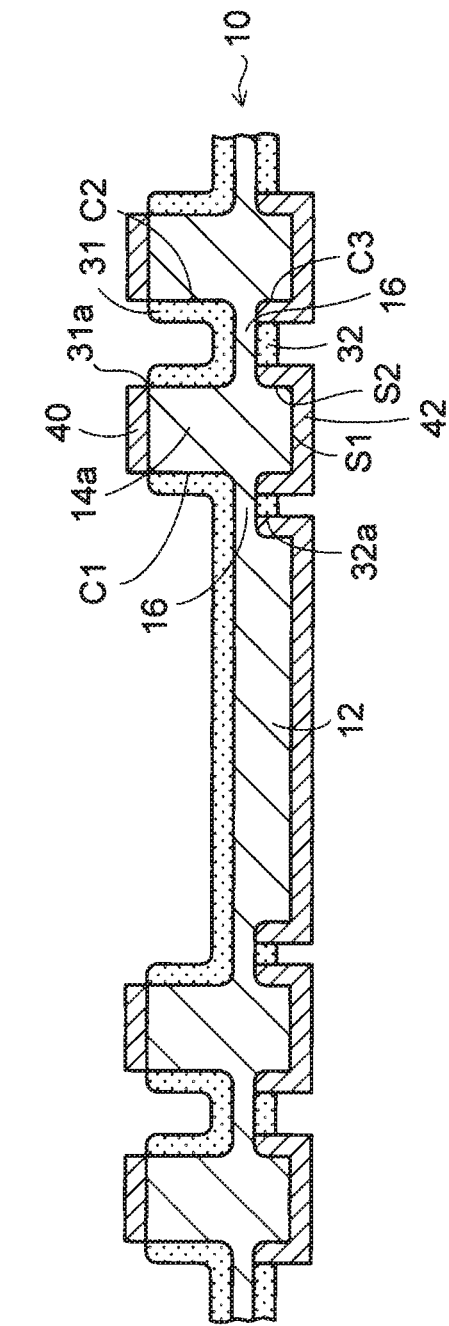
FIG. 9 is a sectional view (Part 6) showing the manufacturing method for the lead frame according to the first embodiment.

Next, as shown in FIG. 9, electrolytic plating is performed using the metal plate 10 as a power feed path for the plating. In the metal plate 10, the die pad portion 12 and the electrodes 14a have been formed. Thus, a first metal plating layer 40 is formed on the upper surfaces of the electrodes 14a within the opening portions 31a of the first plating resist layer 31.

In addition, a second metal plating layer 42 is formed on the lower surfaces S1 and the side surface lower portions S2 of the electrodes 14a and the lower surface and the side surface of the die pad portion 12, which are exposed from the opening portions 32a of the second plating resist layer 32. In this manner, the second metal plating layer 42 is formed to extend from lower ends of the electrodes 14a to the side surfaces of the electrodes 14a.

Thus, each of the terminal portions 14 is configured by the electrode 14a, the first metal plating layer 40 which is formed on the upper surface of the electrode 14a, and the second metal plating layer 42 which is formed on the lower surface S1 and the side surface lower portion S2 of the electrode 14a.

Thus, in the embodiment, the metal plate 10 is etched from not only its upper surface side but also its lower surface side in order to form the electrodes 14a in the metal plate 10. Accordingly, the second metal plating layer 42 can be formed on the side surface lower portions S2 of the electrodes 14a.

As a preferred example of each of the first metal plating layer 40 and the second metal plating layer 42, a multilayer film including a nickel (Ni) layer/a palladium (Pd) layer/a gold (Au) layer sequentially from the electrode 14a side can be used. For example, the Ni layer is 1.0 μm thick, the Pd layer is 0.05 μm thick, and the Au layer is 0.01 μm to 0.02 μm thick. The gold layer may be a gold (Au)-silver (Ag) alloy layer.

Alternatively, a multilayer film including a nickel (Ni) layer/a gold (Au) layer sequentially from the electrode 14a side may be used.

Further, a silver (Ag) plating layer or a tin (Sn) plating layer may be used as each of the first metal plating layer 40 and the second metal plating layer 42.

Thus, the first metal plating layer 40 and the second metal plating layer 42 are formed to contain a noble metal such as gold or silver.

Then, as shown in FIGS. 10A and 10B, the first plating resist layer 31 and the second plating resist layer 32 are removed from a structure body shown in FIG. 9.

In the aforementioned manner, each lead frame 1 according to the first embodiment can be obtained.

As shown in FIGS. 10A and 10B, the lead frame 1 according to the first embodiment includes the die pad portion 12, and the terminal portions 14 which are disposed around the die pad portion 12.

In the lead frame 1, the first recess C1 and the second recess C2 are formed on the upper surface side of the metal plate 10, and the third recess C3 is formed on the lower surface side of the metal plate 10. The third recess C3 is disposed in the position corresponding to the second recess C2. In addition, the first recess C1, the second recess C2 and the third recess C3 are formed to extend up to the middle of the thickness of the metal plate 10.

The die pad portion 12 is made of the bottom plate of the first recess C1 of the metal plate 10. The bottom plate of the first recess C1 is the remaining portion of the metal plate 10 which has been etched to the middle of its thickness from its upper surface side. The die pad portion 12 is provided to protrude downward from the lower surface of the coupling portion 16 of the metal plate 10.

Each of the terminal portions 14 is provided with the electrode 14a which is made of the metal plate 10. The electrode 14a of the terminal portion 14 is formed by the first recess C1, the second recess C2 and the third recess C3. The first recess C1 and the second recess C2 are formed on the upper surface side of the metal plate 10. The third recess C3 is formed on the lower surface side of the metal plate 10.

The electrode 14a is provided to protrude from the upper surface and the lower surface of the metal plate 10. The electrode 14a has the protruding portion E1 provided on the upper surface of the metal plate 10 and the protruding portion E2 provided on the lower surface of the metal plate 10. In addition, one electrode 14a is provided when one protruding portion E2 on the lower surface side is provided correspondingly to one protruding portion E1 on the upper surface side.

As an example, the electrode 14a is formed to protrude like a column. Examples of the column include a circular column and a square column.

In addition, the electrode 14a may be protrusively formed into a truncated cone in which the diameter of a front end is smaller than the diameter of a base portion (the metal plate 10 side diameter).

Further, the side surface of the protruding electrode 14a may be formed into a curved shape. In this case, the side surface of the electrode 14a is formed into the curved shape curved in an axis direction of the electrode 14a protruding like a column.

In this manner, one terminal portion 14 protruding like the column from the upper surface and the lower surface of the metal plate 10 is provided.

Between the first recess C1 and the third recess C3 and between the second recess C2 and the third recess C3, the remaining thin plate portion of the metal plate 10 serves as the coupling portion 16.

The die pad portion 12 is connected and coupled to the electrodes 14a of the terminal portions 14 by the coupling portion 16. In addition, the electrodes 14a of the terminal portions 14 are connected and coupled to one another by the coupling portion 16.

The electrodes 14a of the terminal portions 14 disposed in an outermost region are connected to an outer frame (not shown) by the coupling portion 16 so as to be supported by the outer frame.

Side surfaces of upper portions of the electrodes 14a of the terminal portions 14, the upper surface of the coupling portion 16, and an upper surface of the die pad portion 12 are exposed from the first metal plating layer 40.

In addition, as shown in a partial enlarged sectional view in FIG. 10B, the first metal plating layer 40 is formed on the upper surfaces of the electrodes 14a of the terminal portions 14. In addition, the second metal plating layer 42 is formed on the lower surfaces S1 and the side surface lower portions S2 of the electrodes 14a of the terminal portions 14.

The second metal plating layer 42 has lower surface coating portions 42a with which the lower surfaces S1 of the electrodes 14a are coated, and side surface coating portions 42b with which the side surface lower portions S2 of the electrodes 14a are coated. The second metal plating layer 42 is formed to be separated among the terminal portions 14.

Thus, the second metal plating layer 42 is formed to extend from the lower ends of the electrodes 14a to the side surfaces of the electrodes 14a.

In addition, the coupling portion 16 is coupled to a side surface upper portion of the die pad portion 12, and a side surface lower portion of the die pad portion 12 is disposed to extend downward from the coupling portion 16. Further, the second metal plating layer 42 is formed on the lower surface and the side surface of the die pad portion 12. The second metal plating layer 42 is formed to be separated between the die pad portion 12 and the terminal portions 14.

As will be described later, the coupling portion 16 is wet-etched from its lower surface side to be bored. Thus, the die pad portion 12 is separated from the terminal portions 14, and the terminal portions 14 are separated from one another.

In the embodiment, the first and second recesses C1 and C2 are formed in the upper surface of the metal plate 10, and at the same time, the third recess C3 is formed in advance also in the lower surface of the metal plate 10. Thus, the thickness of the coupling portion 16 is reduced.

When, for example, the thickness of the metal plate 100 is 120 μm, the thickness of the coupling portion of the copper plate 100 is 30 μm according to the method described in the preliminary matter.

On the other hand, in the embodiment, the metal plate 10 is etched to a depth of 90 μm from its upper surface side, and etched to a depth of 10 μm to 20 μm from its lower surface side. Thus, the coupling portion 16 of the metal plate 10 is 10 μm to 20 μm (120 μm−(90 μm+(10 μm to 20 μm))) thick. Thus, an etching amount of the coupling portion 16 can be reduced.

Accordingly, a processing time for etching the coupling portion 16 can be shortened so that production efficiency can be improved.

In addition, in the embodiment, the second metal plating layer 42 is formed on the lower surfaces S1 and the side surface lower portions S2 of the electrodes 14a of the terminal portions 14 of the lead frame 1, as shown in the partial enlarged sectional view in FIG. 10B.

As will be described later, when the lead frame 1 in FIGS. 10A and 10B is used to form an electronic component device, the terminal portions 14 are separated individually and connected to a mount board through solders. On this occasion, the solders are formed to extend from the lower surface coating portions 42a of the second metal plating layer 42 of the terminal portions 14 to the side surface coating portions 42b of the second metal plating layer 42. Accordingly, each of contact areas between the terminal portions 14 of the electronic component device and the solders can be increased.

Thus, connection strength between the terminal portions 14 of the electronic component device and the mount board can be enhanced. Accordingly, reliability of the electronic component device can be improved.

In the example of FIGS. 10A and 10B, the terminal portions 14 are disposed like islands (FIG. 7B). However, lead wiring portions in which the terminal portions 14 are used as pads and lead-out wirings are connected to the pads may be formed to be separated from one another.

Next, a method for using the lead frame 1 in FIGS. 10A and 10B to form the electronic component device will be described.

As shown in FIG. 11A, a semiconductor chip 50 having connection terminals 52 provided on its front surface is prepared. The connection terminals 52 of the semiconductor chip 50 face up and a back surface of the semiconductor chip 50 is fixed on the die pad portion 12 of the lead frame 1 by an adhesive agent 54.

As shown in a partial reduced plan view of FIG. 11B, the semiconductor chip 50 is mounted on the square die pad portion 12 and surrounded by the terminal portions 14.

The semiconductor chip 50 is an example of the electronic component. Various electronic components may be mounted on the die pad portion 12 of the lead frame 1.

Successively, the connection terminals 52 of the semiconductor chip 50 are connected to the first metal plating layer 40 in upper ends of the terminal portions 14 of the lead frame 1 through the wires W by a wire bonding method. As each of the wires W, a metal wire made of gold, aluminum, copper, or the like, can be used.

Figure 12A:
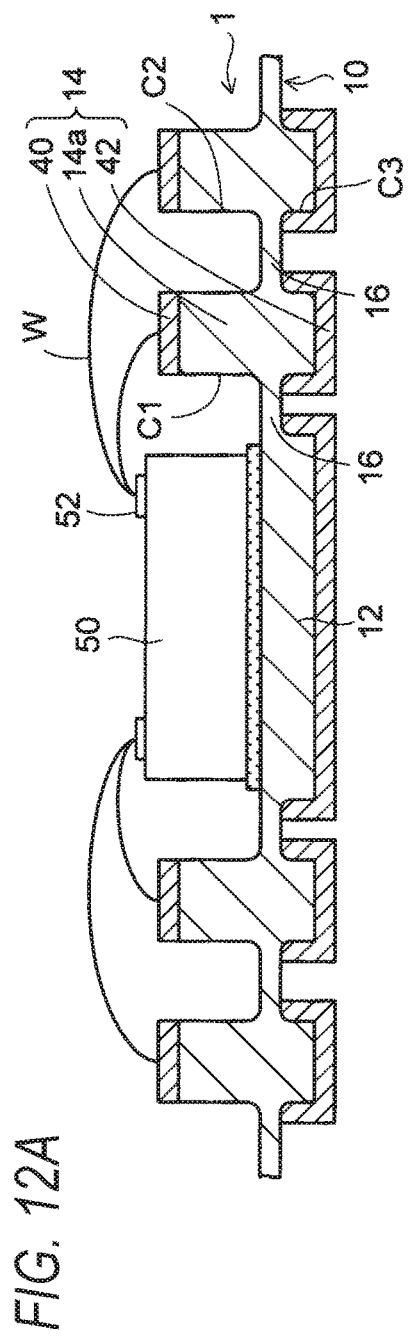
FIGS. 12A and 12B are sectional views (Part 2) showing the manufacturing method for the electronic component device according to the first embodiment.
Figure 12B:
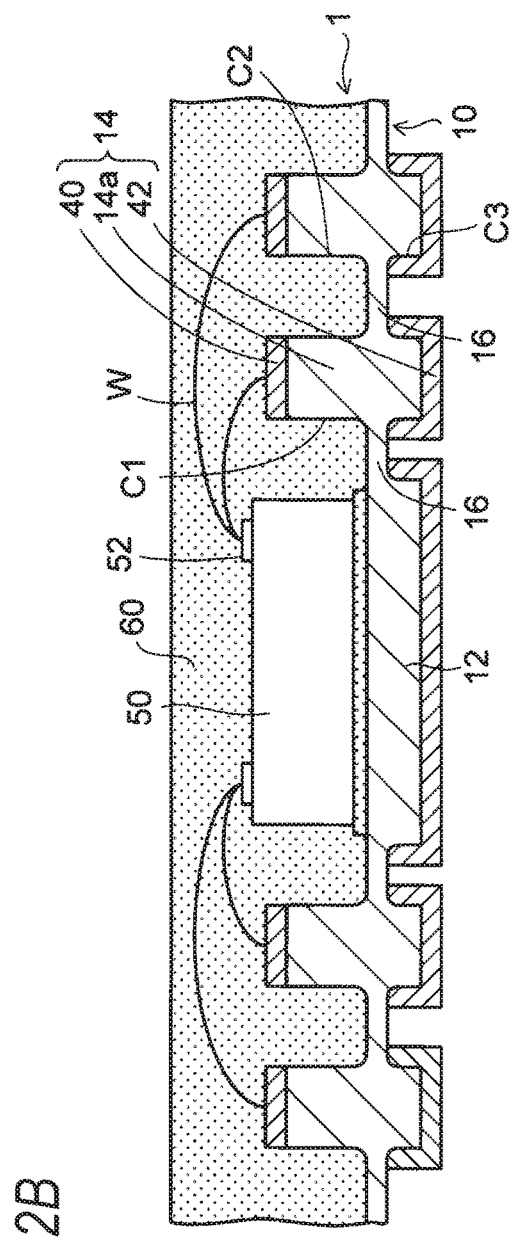

Further, a sealing resin (encapsulating resin) 60 is formed on the lead frame 1 to seal the semiconductor chip 50, the terminal portions 14, and the wires W, as shown in FIG. 12B. As an example of the sealing resin 60, an insulating resin such as an epoxy resin can be used.

On this occasion, the die pad portion 12 and the terminal portions 14 are coupled by the coupling portion 16. Therefore, the sealing resin 60 is not formed on the lower surface side of the lead frame 1 so that the second metal plating layer 42 on the lower sides of the terminal portions 14 can be exposed.

Figure 13:
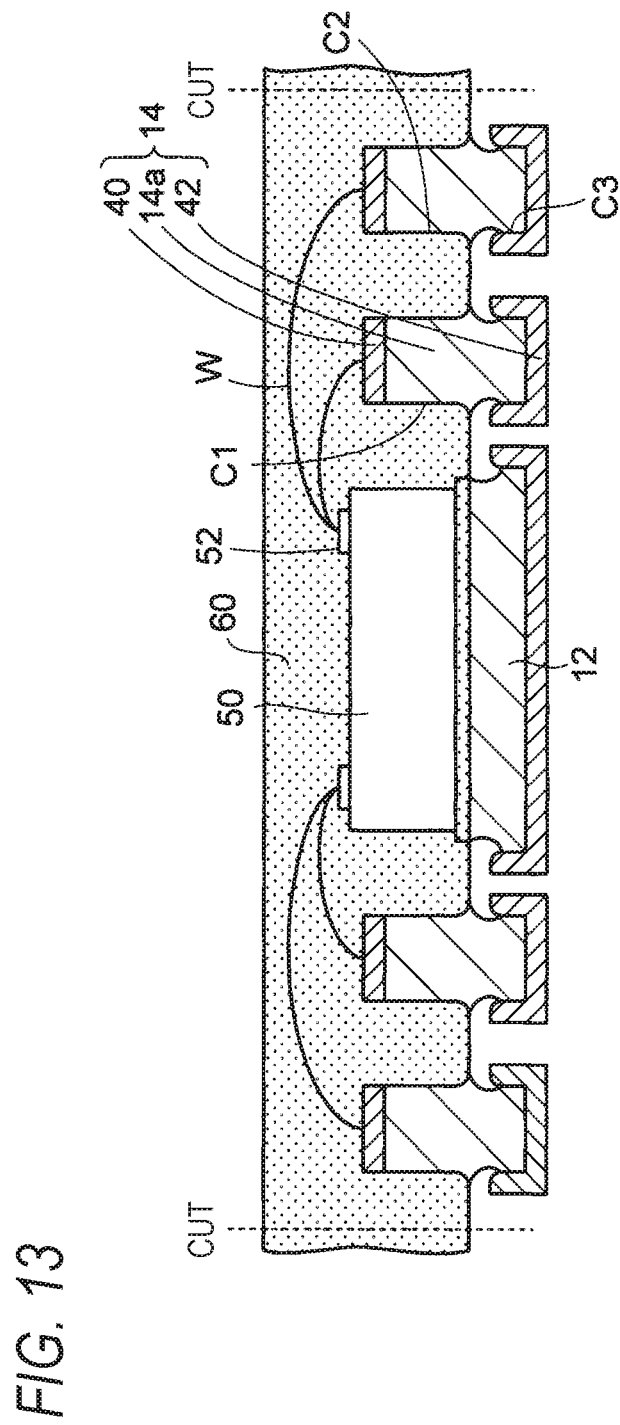
FIG. 13 is a sectional view (Part 3) showing the manufacturing method for the electronic component device according to the first embodiment.

Next, as shown in FIG. 12B and FIG. 13, using the second metal plating layer 42 in the lower surfaces of the terminal portions 14 as a mask, the coupling portion 16 of the lead frame 1 is wet-etched from the lower surface side. The coupling portion 16 is bored by wet etching to expose a lower surface of the sealing resin 60. Thus, the lower surface of the metal plate 10 is etched using the second metal plating layer 42 as the mask. Accordingly, the metal plate 10 is removed.

Thus, the die pad portion 12 is separated from the terminal portions 14, and the terminal portions 14 are separated individually, as shown in FIG. 13.

The die pad portion 12 and each terminal portion 14 are integrated with each other by the sealing resin 60. Accordingly, even when the die pad portion 12 and the terminal portion 14 are separated from each other, they are supported by the sealing resin 60.

Then, the sealing resin 60 and the lead frame 1 are cut in order to obtain individual products. The product regions disposed in the lattice pattern in the metal plate 10 are divided into individual product regions. Thus, individual electronic component devices can be obtained.

Figure 14A:
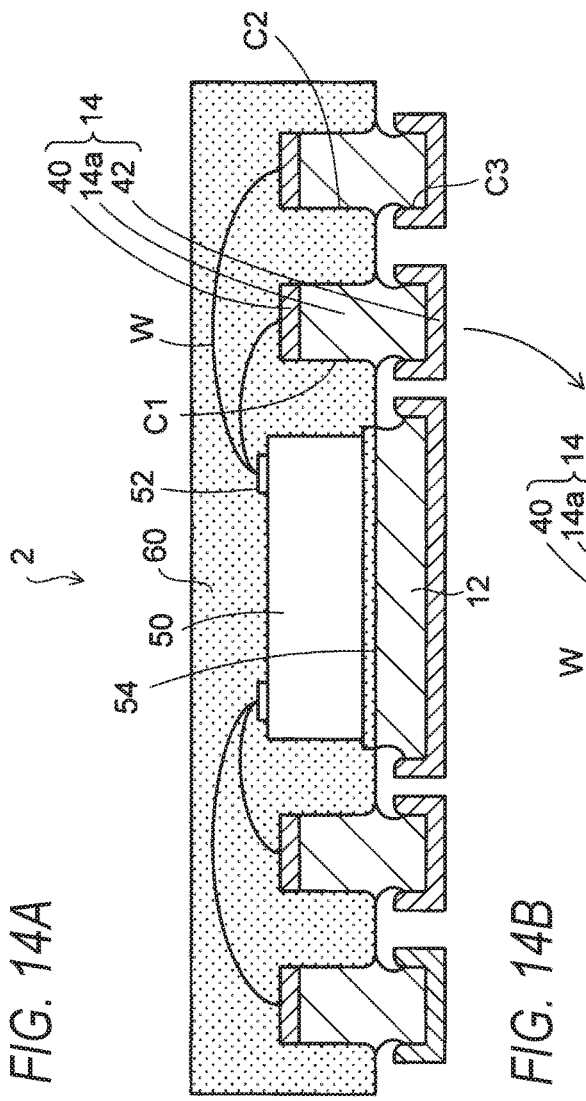
FIGS. 14A and 14B are sectional views showing the electronic component device according to the first embodiment.
Figure 14B:
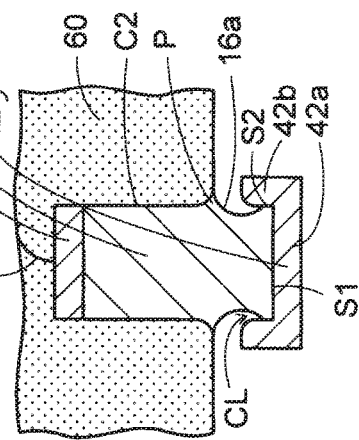

In the aforementioned manner, each electronic component device 2 according to the first embodiment can be obtained, as shown in FIGS. 14A and 14B.

As shown FIGS. 14A and 14B, in the electronic component device 2 according to the first embodiment, the back surface of the semiconductor chip 50 having the connection terminals 52 face up is fixed on the die pad portion 12 by the adhesive agent 54. The die pad portion 12 is made of the metal plate 10. The plurality of terminal portions 14 are disposed around the die pad portion 12 to be separated like islands. Each of the terminal portions 14 is provided like a column including an upper end and a lower end. The lower end side of the columnar terminal portion 14 is provided to protrude downward from the sealing resin 60.

Refer to a partial enlarged sectional view of FIGS. 14A and 14B additionally. The terminal portion 14 is formed to include the electrode 14a, the first metal plating layer 40 and the second metal plating layer 42. The first metal plating layer 40 is formed on the upper surface of the electrode 14a. The second metal plating layer 42 is formed on the lower surface S1 and the side surface lower portion S2 of the electrode 14a.

In addition, the connection terminals 52 of the semiconductor chip 50 are connected to the first metal plating layer 40 in the upper surfaces of the terminal portions 14 through the wires W. Moreover, the sealing resin 60 is formed to seal the semiconductor chip 50, the wires W and the upper portions of the terminal portions 14.

The upper ends and the side surface upper portions of the terminal portions 14 are embedded in the sealing resin 60. The lower ends and the side surface portions of the terminal portions 14 protrude from the sealing resin 60, and the second metal plating layer 42 is exposed from the sealing resin 60.

Using the second metal plating layer 42 as a mask, the aforementioned coupling portion 16 of the lead frame 1 in FIGS. 10A and 10B is wet-etched from the lower surface side. Thus, the terminal portions 14 of the electronic component device 2 are separated from one another. On this occasion, the coupling portion 16 exposed from the side surface coating portions 42b of the second metal plating layer 42 is etched isotropically in the thickness direction.

Refer to the partial enlarged sectional view in FIGS. 14A and 14B. Each of the side surface coating portions 42b of the second metal plating layer 42 is a thin film. Accordingly, an etching surface 16a of the coupling portion 16 goes around to inner surfaces of the side surface coating portions 42b.

Therefore, clearances CL formed by the wet etching are formed between the electrodes 14a and the side surface coating portions 42b of the second metal plating layer 42 formed on the side surface lower portions S2 of the electrodes 14a.

In addition, the etching surface 16a of the coupling portion 16 intersects with inner surfaces of the first recess C1 and the second recess C2. Thus, side surface protrusions P protruding outward are formed on the side surfaces of the electrodes 14a of the terminal portions 14.

In addition, the same clearance as each of the clearances CL of the terminals 14a is formed in the side surface of the die pad portion 12.

In the embodiment, the coupling portion 16 is isotropically etched from upper ends of the side surface coating portions 42b of the second metal plating layer 42, and the etching amount of the coupling portion 16 is small. Therefore, thinning of each electrode 14a or a lateral protrusion amount of the second metal plating layer 42 can be suppressed. Accordingly, the electronic component device 2 according to the embodiment is favorable to form fine terminal portions 14 at narrow pitches.

Figure 15A:
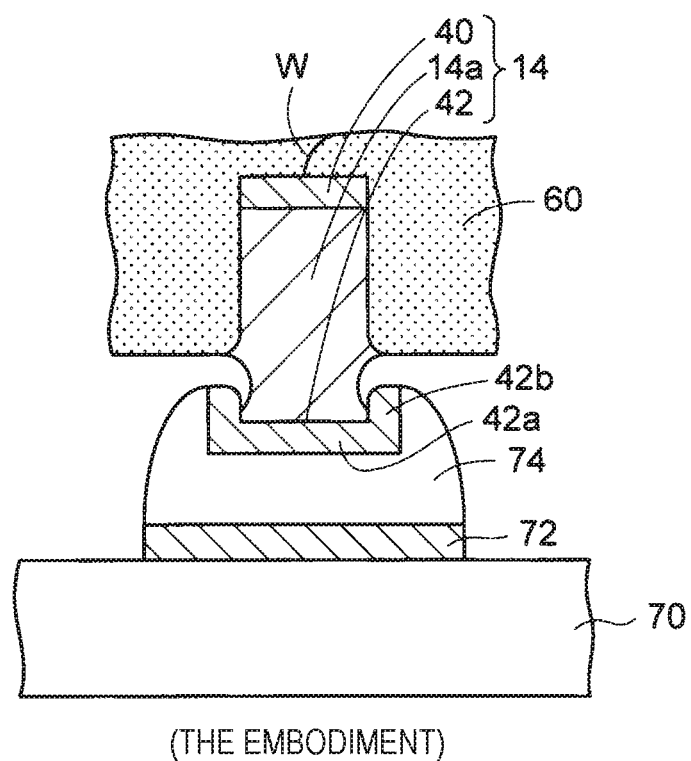
FIG. 15A is a sectional view showing a state in which a terminal portion of the electronic component device in FIGS. 14A and 14B is connected to a mount board through a solder.

FIG. 15A shows a state in which the terminal portions 14 of the electronic component device 2 in FIGS. 14A and 14B are connected to connection electrodes 72 of a mount board 70 such as a motherboard through solders 74. As shown in FIG. 15A, in the electronic component device 2 according to the embodiment, each of the solders 74 is formed to extend from the lower surface coating portion 42a of the second metal plating layer 42 of the terminal portion 14 of the electronic component device 2 to the side surface coating portion 42b of the second metal plating layer 42.

Thus, a contact area between the second metal plating layer 42 of the terminal portion 14 and the solder 74 can be secured largely. Therefore, connection strength between the terminal portion 14 of the electronic component device 2 and the solder 74 can be enhanced so that reliability of the electronic component device 2 can be improved.

In a boundary portion between the lower end side of the terminal portion 14 and the sealing resin 60, the side surface of the electrode 14a is exposed from the side surface coating portion 42b of the second metal plating layer 42 and the sealing resin 60. Copper oxide is formed in the exposed portion of the side surface of the electrode 14a. Accordingly, the exposed portion of the side surface of the electrode 14a can prevent the solder 74 from excessively crawling up to the side surface of the electrode 14a.

Wettability of the solder 74 in the side surface of the electrode 14a is lower than wettability of the solder in the side surface coating portion 42b of the second metal plating layer 42. Accordingly, the solder can be prevented from crawling up.

Figure 15B:
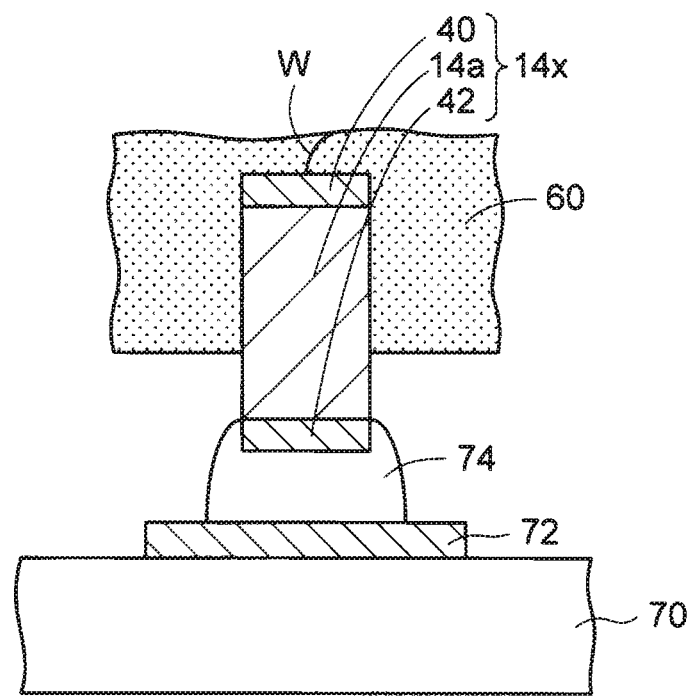
FIG. 15B shows a comparative example.

As shown in a comparative example of FIG. 15B differently from the embodiment, no solders are formed on side surfaces of electrodes 14a in terminal portions 14x in which a second metal plating layer 42 is formed only on lower surfaces of the electrodes 14a. Therefore, particularly when a pitch between adjacent ones of the terminal portions 14x is narrowed to thereby reduce an area of each terminal portion 14x accordingly, a contact area between the second metal plating layer 42 of the terminal portion 14x and the solder 74 cannot be obtained sufficiently.

The second metal plating layer 42 whose surface is made of the gold layer etc. can obtain solder wettability. Since copper oxide is formed in the exposed portions of the electrodes 14a (copper), the exposed portions of the electrodes 14a cannot obtain solder wettability.

Second Embodiment

Figure 19:
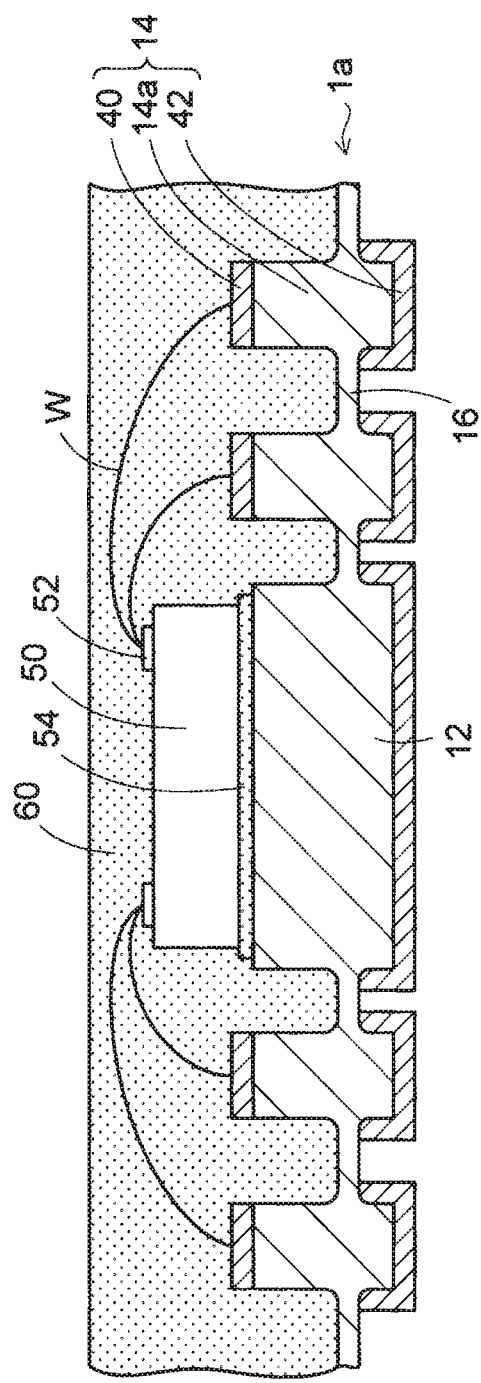
FIG. 19 is a sectional view showing a manufacturing method for an electronic component device according to the second embodiment.
Figure 20:
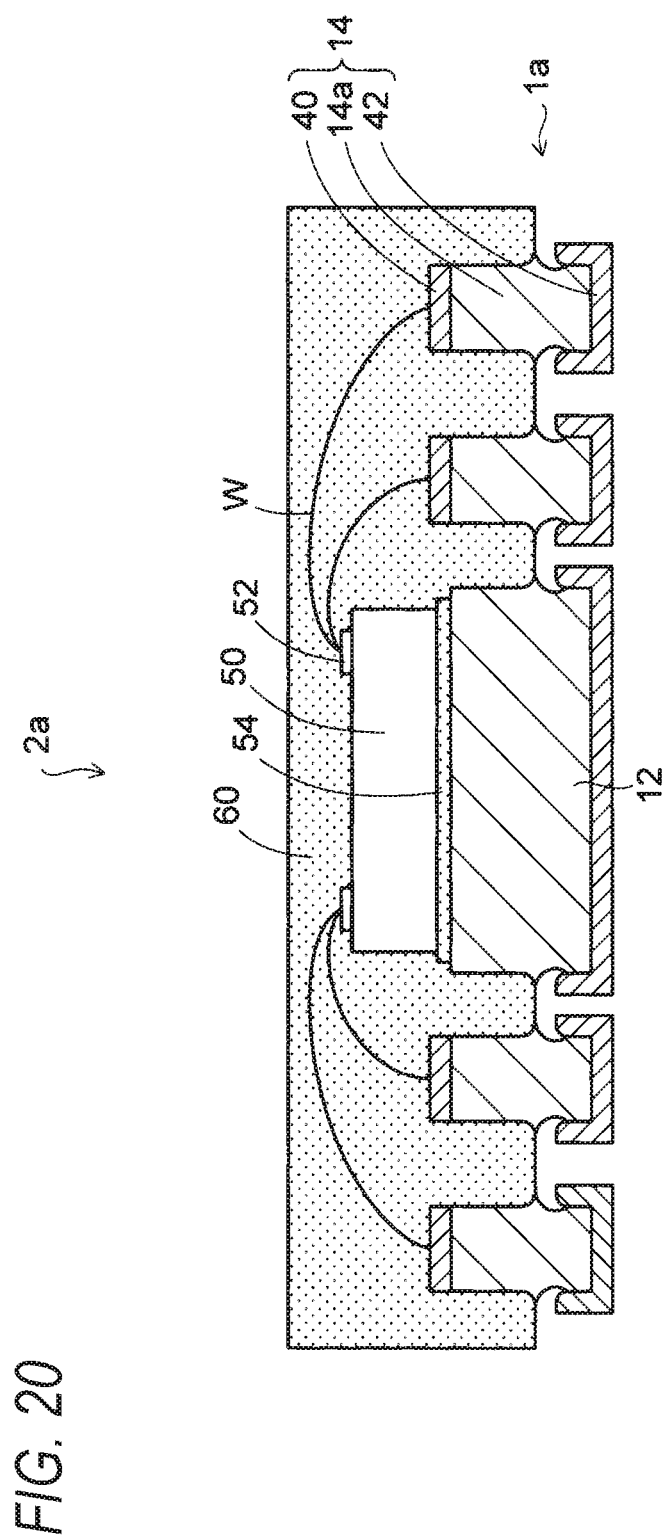
FIG. 20 is a sectional view showing the electronic component device according to the second embodiment.

FIGS. 16A and 16B, FIGS. 17A and 17B and FIG. 18 are views for explaining a lead frame according to a second embodiment. FIG. 19 and FIG. 20 are views for explaining an electronic component device according to the second embodiment.

In the second embodiment, a die pad portion of the lead frame is formed to protrude from a lower surface and an upper surface of a metal plate.

Figure 16A:
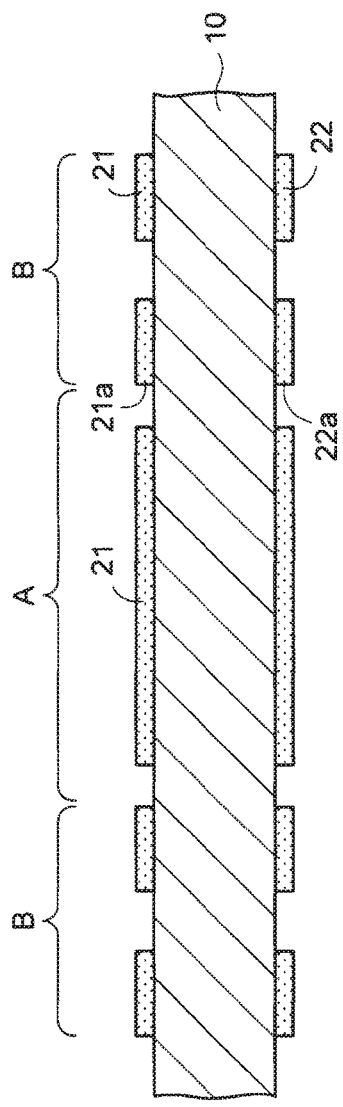
FIGS. 16A and 16B are a sectional view and a plan view (Part 1) showing a manufacturing method for a lead frame according to a second embodiment.
Figure 16B:
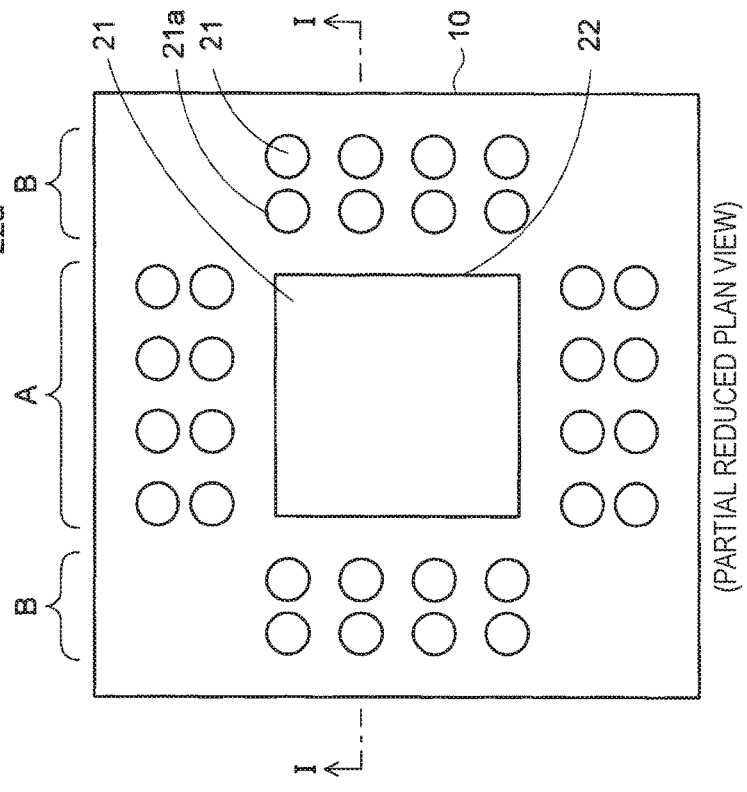

In the second embodiment, as shown in FIGS. 16A and 16B, patterns of a first resist layer 21 are also provided in a die pad formation region A on the upper surface of the metal plate 10 in the aforementioned step of FIGS. 5A and 5B.

Next, as shown in FIGS. 17A and 17B, using the first resist layer 21 and a second resist layer 22 as masks, the metal plate 10 is wet-etched to the middle of its thickness from opposite surface sides by the same method as the aforementioned step of FIG. 6A.

FIGS. 17A and 17B show a state in which the first resist layer 21 and the second resist layer 22 have been removed.

In the second embodiment, the die pad portion 12 is formed to protrude from a lower surface and an upper surface of a coupling portion 16 of the metal plate 10, as shown in FIGS. 17A and 17B.

Successively, the same steps as the aforementioned steps of FIGS. 8A and 8B, FIG. 9, and FIGS. 10A and 10B are performed on a structure body shown in FIG. 17A.

Figure 18:
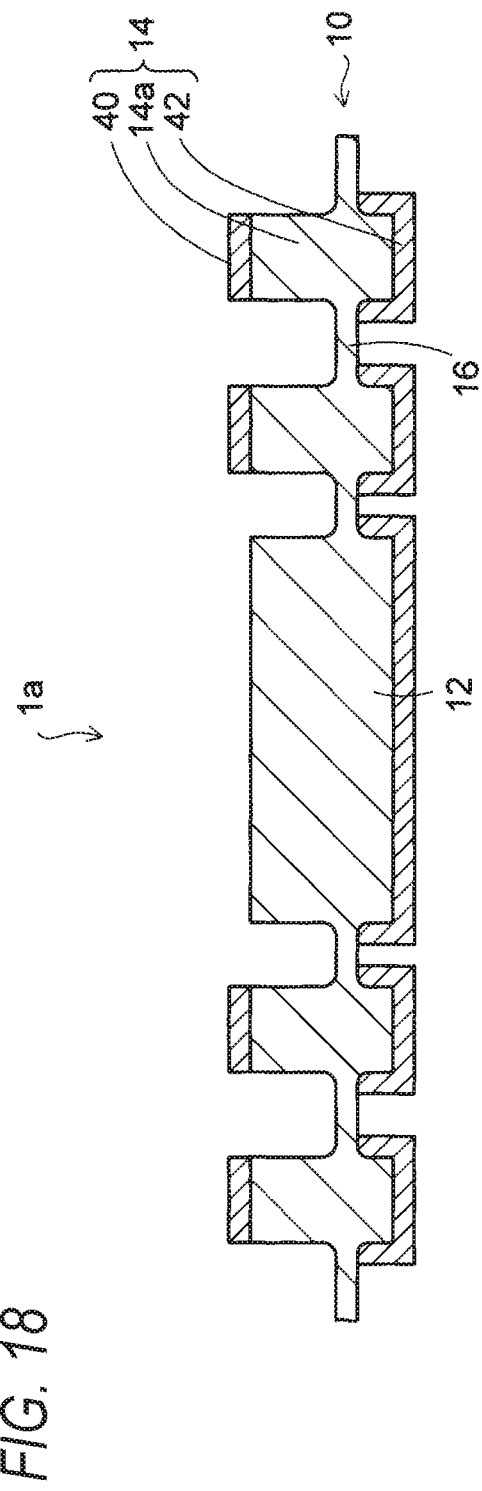
FIG. 18 is a sectional view (Part 3) showing the manufacturing method for the lead frame according to the second embodiment.

Thus, a lead frame 1a according to the second embodiment can be obtained, as shown in FIG. 18. The lead frame 1a according to the second embodiment is different from the lead frame 1 according to the first embodiment in that the die pad portion 12 protrudes from the upper surface of the metal plate 10. A height position of an upper surface of the die pad portion 12 is the same as a height position of an upper surface of each of electrodes 14a of terminal portions 14.

The other elements of the lead frame 1a according to the second embodiment are the same as those of the lead frame 1 according to the first embodiment.

Next, as shown in FIG. 19, a semiconductor chip 50 is fixed on the die pad portion 12 of the lead frame 1a in FIG. 18 by an adhesive agent 54 in the same manner as the aforementioned step of FIG. 11A. Further, connection terminals 52 of the semiconductor chip 50 are connected to a first metal plating layer 40 of the terminal portions 14 of the lead frame 1a through wires W in the same manner as the aforementioned step of FIG. 12A. Further, in the same manner as the aforementioned step of FIG. 12B, a sealing resin 60 is formed on the lead frame 1a to seal the semiconductor chip 50, the terminal portions 14 and the wires W.

Next, as shown in FIG. 20, using a second metal plating layer 42 in lower surfaces of the terminal portions 14 as a mask, the coupling portion 16 of the lead frame 1a is wet-etched from the lower surface side in the same manner as the aforementioned step of FIG. 12B and FIG. 13.

Thus, the die pad portion 12 is separated from the terminal portions 14, and the terminal portions 14 are separated individually.

Then, the sealing resin 60 and the lead frame 1a are cut in order to obtain each individual product.

In the aforementioned manner, an electronic component device 2a according to the second embodiment can be obtained.

The lead frame 1a and the electronic component device 2a according to the second embodiment can obtain the same effects as those according to the first embodiment.

Further, as shown in FIG. 20, in the lead frame 1a according to the second embodiment, the die pad portion 12 is formed to have the same thickness as the metal plate 10 which has not been machined yet. Therefore, the die pad portion 12 according to the second embodiment has a larger volume than the die pad portion 12 according to the first embodiment.

The die pad portion 12 is made of a copper plate high in thermal conductivity. Accordingly, heat generated from the semiconductor chip 50 can be dissipated from the die pad portion 12 to the outside efficiently. Thus, heat dissipation properties of the electronic component device can be improved.

In addition, the same clearance and the same side surface protrusion as the clearance CL and the side surface protrusion P of the electrode 14a in the aforementioned partial enlarged sectional view in FIGS. 14A and 14B are formed in a side surface of the die pad portion 12 in the same manner as in the first embodiment.

Third Embodiment

Figure 21:
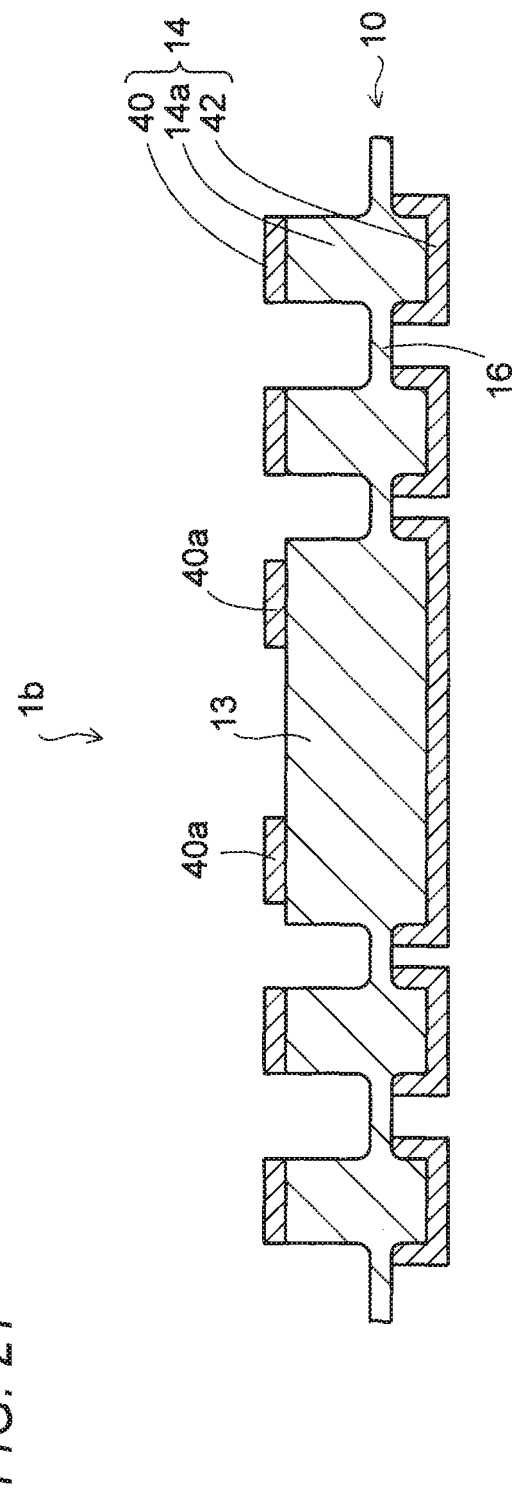
FIG. 21 is a sectional view showing a lead frame according to a third embodiment.
Figure 22:
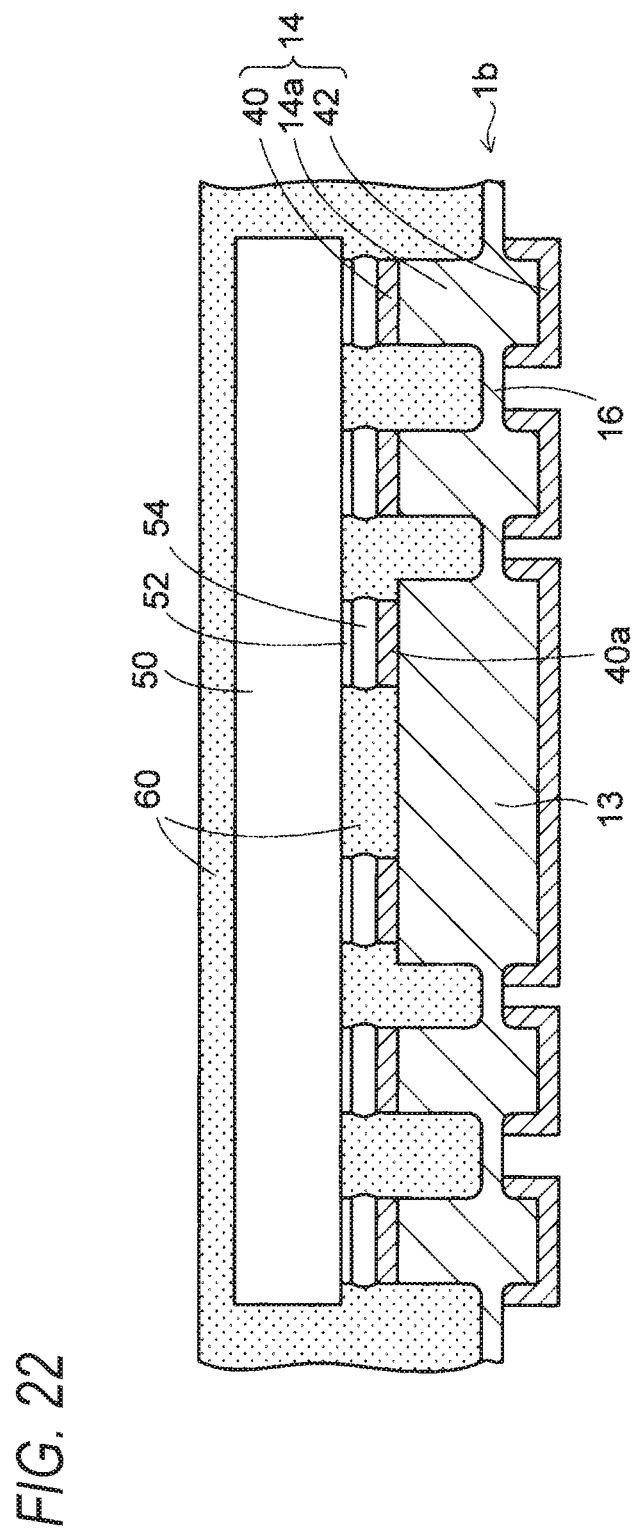
FIG. 22 is a sectional view showing a manufacturing method for an electronic component device according to the third embodiment.
Figure 23:
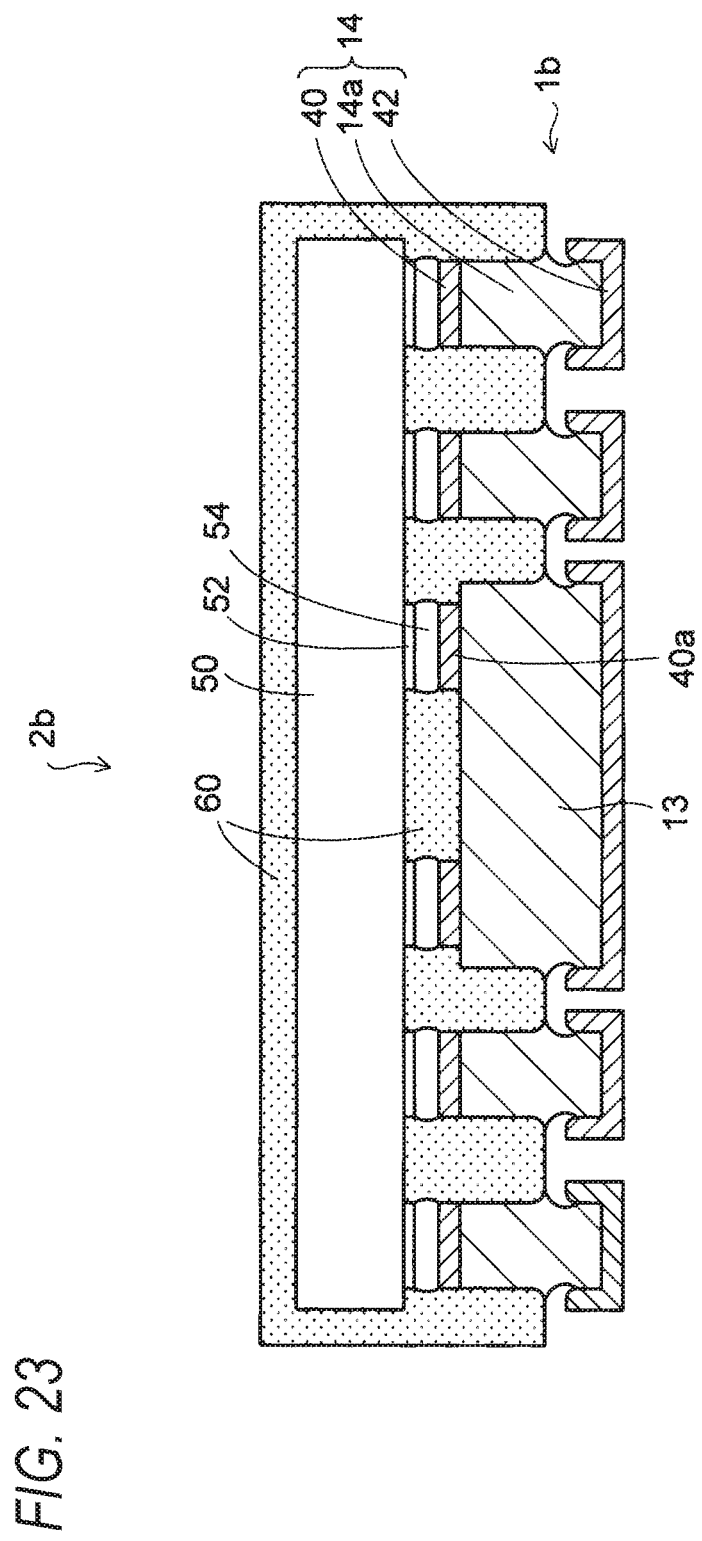
FIG. 23 is a sectional view showing the electronic component device according to the third embodiment.

FIGS. 21 to 23 are views for explaining a lead frame and an electronic component device according to a third embodiment. A semiconductor chip is flip-chip connected to the lead frame in the third embodiment.

As shown in FIG. 21, in manufacturing the aforementioned lead frame 1a of FIG. 18 according to the second embodiment, the die pad portion 12 is formed as a common terminal portion 13 in the third embodiment.

A plurality of connection electrodes 40a which are made of a first metal plating layer are formed on an upper surface of the common terminal portion 13. The connection electrodes 40a which are made of the first metal plating layer are formed on the upper surface of the common terminal portion 13 simultaneously in a step of forming the first metal plating layer 40 on upper surfaces of electrodes 14a.

Thus, as shown in FIG. 21, a lead frame 1b according to the third embodiment can be obtained. As shown in FIG. 21, the aforementioned die pad portion 12 of the lead frame 1a of FIG. 18 according to the second embodiment becomes the common terminal portion 13 in the third embodiment. The plurality of connection electrodes 40a made of the first metal plating layer 40 are formed on the upper surface of the common terminal portion 13.

In the third embodiment, the connection electrodes 40a on the common terminal portion 13 are formed in order to flip-chip connect a semiconductor chip, similarly to terminal portions 14. For example, each of the connection electrodes 40a is formed into a circular pad shape in plan view.

Next, a semiconductor chip 50 provided with connection terminals 52 is prepared, as shown in FIG. 22. Arrays of the terminal portions 14 and the connection electrodes 40a in the lead frame 1b correspond to the connection terminals 52 of the semiconductor chip 50.

The connection terminals 52 of the semiconductor chip 50 are flip-chip connected to the first metal plating layer 40 in upper ends of the terminal portions 14 and the connection electrodes 40a on the common terminal portion 13 through bonding portions 54 such as solder bumps.

Various methods can be used as a bonding method for the semiconductor chip 50. As each of the bonding portions 54, a gold bump may be used in place of the solder bump.

In addition, copper pillars may be formed on the connection terminals 52 of the semiconductor chip 50 so that the copper pillars can be bonded to the terminal portions 14 and the connection electrodes 40a through solders.

Then, also as shown in FIG. 22, a space between the semiconductor chip 50 and the lead frame 1b is filled with a sealing resin 60, and an upper surface and a side surface of the semiconductor chip 50 are sealed with the sealing resin 60.

Further, as shown in FIG. 23, using a second metal plating layer 42 in lower surfaces of the terminal portions 14 as a mask, a coupling portion 16 of the lead frame 1b is wet-etched from its lower surface side in the same manner as the aforementioned step of FIG. 12B and FIG. 13.

Thus, the common terminal portion 13 is separated from the terminal portions 14, and the plurality of terminal portions 14 are separated individually.

Then, the sealing resin 60 and the lead frame 1b are cut in order to obtain each individual product.

In the aforementioned manner, an electronic component device 2b according to the third embodiment can be obtained.

In the third embodiment, similarly to the terminal portions 14, a lower end and a side surface portion of the common terminal portion 13 protrude from the sealing resin 60, and the second metal plating layer 42 on the lower side of the common terminal portion 13 is exposed from the sealing resin 60.

The lead frame 1b and the electronic component device 2b according to the third embodiment can obtain the same effects as those according to the first embodiment.

Further, the semiconductor chip can be mounted by flip-chip connection in the third embodiment. Accordingly, the lead frame 1b can be adapted to multiple terminals of a semiconductor chip.

In addition, the common terminal portion 13 of the lead frame 1b can be used as a common power supply terminal or a common ground terminal corresponding to the plurality of connection terminals of the semiconductor chip. Therefore, the lead frame 1b can be adapted to more multiple terminals of a semiconductor chip.

Fourth Embodiment

Figure 24:
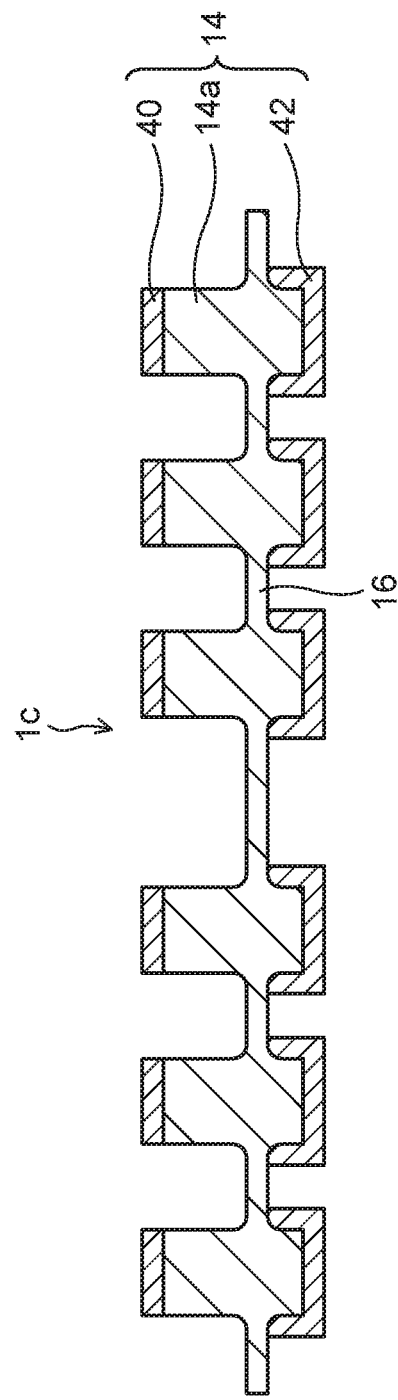
FIG. 24 is a sectional view showing a lead frame according to a fourth embodiment.
Figure 25:
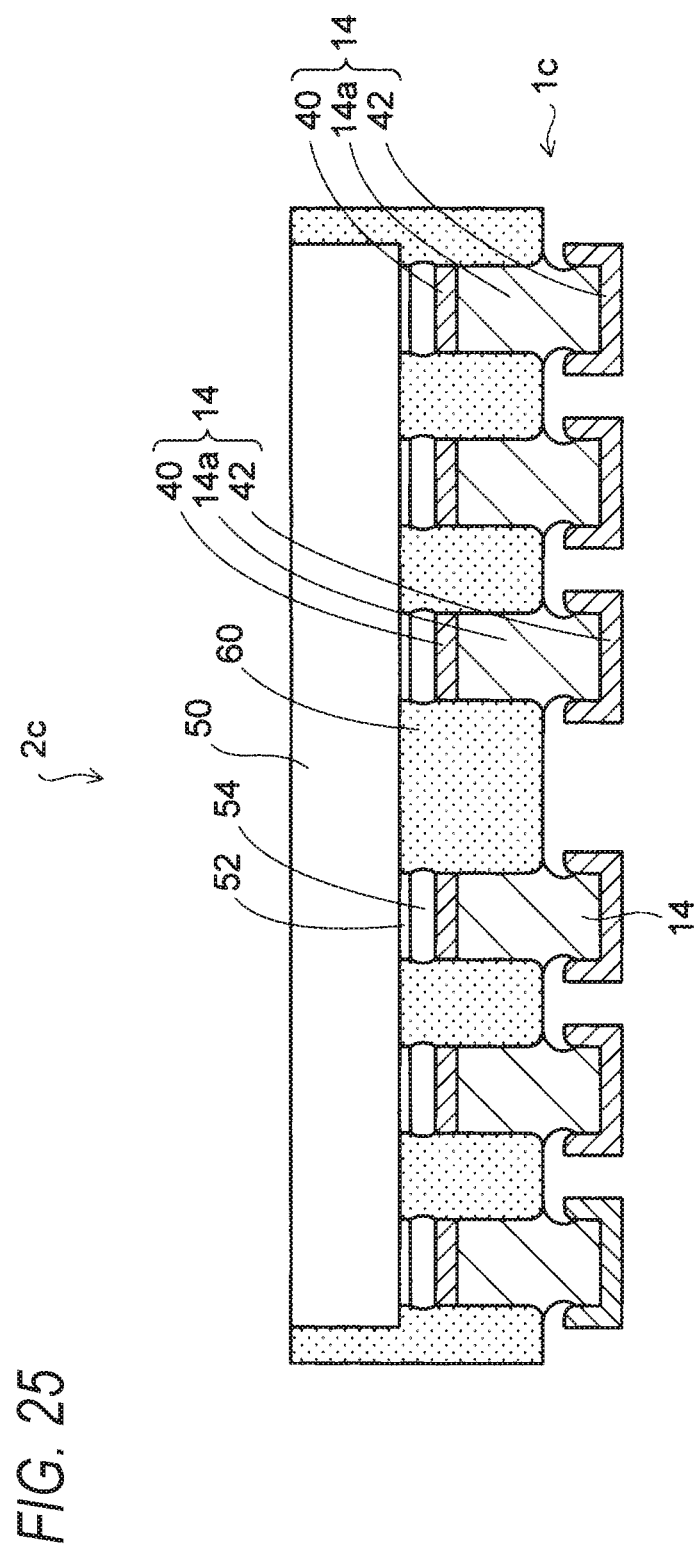
FIG. 25 is a sectional view showing an electronic component device according to the fourth embodiment.

FIG. 24 is a view showing a lead frame 1c according to a fourth embodiment. FIG. 25 is a view for explaining an electronic component device 2c according to the fourth embodiment.

As shown in FIG. 24, the lead frame 1c according to the fourth embodiment has a configuration in which terminal portions 14 are divided and disposed in a lattice pattern in place of the common terminal portion 13 in the aforementioned lead frame 1b in FIG. 21 according to the third embodiment.

As shown in FIG. 25, connection terminals 52 of a semiconductor chip 50 are flip-chip connected to a first metal plating layer 40 in upper ends of the terminal portions 14 through bonding portions 54 such as solder bumps. Further, a lower surface and a side surface of the semiconductor chip 50, and the first metal plating layer 40 and upper portions of electrodes 14a in the terminal portions 14 are sealed with a sealing resin 60.

A lower end and a side surface portion of the electrode 14a of each terminal portion 14 protrude from the sealing resin 60, and a second metal plating layer 42 is exposed from the sealing resin 60.

In the example of FIG. 25, a back surface of the semiconductor chip 50 is exposed from the sealing resin 60. However, the back surface of the semiconductor chip 50 may be sealed with the sealing resin 60.

The electronic component device 2c in FIG. 25 is the same as the electronic component device 2b in FIG. 23 according to the third embodiment, except that the terminal portions 14 are disposed in place of the common terminal portion 13.

The electronic component device 2c according to the fourth embodiment is manufactured by the same method as the manufacturing method for the electronic component device 2b in FIG. 23 according to the third embodiment.

The lead frame 1c and the electronic component device 2c according to the fourth embodiment can obtain the same effects as those according to the first embodiment.

As described above, the exemplary embodiment and the modification are described in detail. However, the present invention is not limited to the above-described embodiment and the modification, and various modifications and replacements are applied to the above-described embodiment and the modifications without departing from the scope of claims.

Various aspects of the subject matter described herein are set out non-exhaustively in the following numbered clauses:

(1) A method of manufacturing a lead frame, comprising:
a) preparing a metal plate;
b) machining the metal plate to thereby form a columnar electrode; and
c) forming a metal plating layer on a lower surface of the electrode and a portion of a side surface of the electrode to obtain a terminal portion comprising the columnar electrode and the metal plating layer.

(2) The method according to clause (1), wherein
step (b) comprises forming a die pad portion,
the terminal portion comprises a plurality of terminal portions, and
the plurality of terminal portions are disposed to surround the die pad portion.

(3) A method of manufacturing an electronic component device, the method comprising:
a) forming a lead frame comprising a terminal portion, the terminal portion comprising a columnar electrode and a metal plating layer, wherein the metal plating layer is formed on a lower surface of the electrode and a portion of a side surface of the electrode;
b) mounting an electronic component on the lead frame to be electrically connected to the terminal portion;
c) sealing the lead frame and the electronic component with a sealing resin; and
d) etching a portion of the lead frame using the metal plating layer as a mask.

(4) The method according to clause (3), wherein
the lead frame further comprises a die pad portion,
the terminal portion comprises a plurality of terminal portions,
the plurality of terminal portions are disposed to surround the die pad portion, and
step (b) comprises mounting the electronic component on the die pad portion.

What is claimed is:

1. A lead frame comprising:
a plurality of terminal portions comprising a plurality of columnar electrodes and a metal plating layer, wherein the metal plating layer is formed on a lower surface of each of the plurality of columnar electrodes and a portion of a side surface of each of the plurality of columnar electrodes; and
a coupling portion coupled to the plurality of terminal portions,
wherein the coupling portion and the plurality of columnar electrodes are integrally formed with each other of a same material.

2. The lead frame according to claim 1, further comprising a die pad portion, wherein the plurality of terminal portions are disposed to surround the die pad portion.

3. The lead frame according to claim 2, wherein the metal plating layer is formed on a lower surface and a side surface of the die pad portion.

4. The lead frame according to claim 1, wherein the plurality of columnar electrodes is formed of copper, and the metal plating layer contains a noble metal.

5. The lead frame according to claim 1, wherein a lower surface of the coupling portion is exposed from the metal plating layer.

6. The lead frame according to claim 1, wherein the metal plating layer is formed on an upper surface of each of the plurality of columnar electrodes.

7. An electronic component device, comprising:
a lead frame comprising a terminal portion, the terminal portion comprising a columnar electrode and a metal plating layer, wherein the metal plating layer is formed on a lower surface of the columnar electrode and a first portion of a side surface of the columnar electrode, the first portion of the side surface of the columnar electrode being adjacent to the lower surface of the columnar electrode;
an electronic component mounted on the lead frame to be electrically connected to the terminal portion; and
a sealing resin that seals the lead frame and the electronic component,
wherein a second portion of the side surface of the columnar electrode is embedded in the sealing resin, the second portion of the side surface of the columnar electrode being adjacent to an upper surface of the columnar electrode, the metal plating layer is exposed from the sealing resin, and a third portion of the side surface of the columnar electrode disposed between the first and second portions of the side surface of the columnar electrode is exposed from both the metal plating layer and the sealing resin.

8. The electronic component device according to claim 7, wherein a clearance is provided between the side surface of the columnar electrode and the metal plating layer.

9. The electronic component device according to claim 7, wherein a protrusion is formed on the side surface of the columnar electrode.

10. The electronic component device according to claim 7, wherein the third portion of the side surface of the columnar electrode has a curved shape which is concave along an axial direction of the columnar electrode.

11. The electronic component device according to claim 7, further comprising an oxide film formed on the third portion of the side surface of the columnar electrode.

12. The electronic component device according to claim 7, wherein the lead frame further comprises a die pad portion on which the electronic component is mounted, and a connection terminal of the electronic component is electrically connected to an upper end of the columnar electrode via wire.

13. The electronic component device according to claim 7, wherein the lead frame further comprises a die pad portion on which the electronic component is mounted, and the metal plating layer is formed on a lower surface and a side surface of the die pad portion.

14. The electronic component device according to claim 7, wherein a connection terminal of the electronic component and an upper end of the columnar electrode are connected via a bump.

15. The electronic component device according to claim 7, wherein the metal plating layer is formed on an upper surface of the columnar electrode.

16. The electronic component device according to claim 7, wherein the columnar electrode is formed of copper, and the metal plating layer contains a noble metal.

* * * * *